(12) United States Patent
Tsuge

(10) Patent No.: US 10,089,932 B2
(45) Date of Patent: Oct. 2, 2018

(54) METHOD FOR POWERING OFF DISPLAY APPARATUS, AND DISPLAY APPARATUS

(71) Applicant: JOLED INC., Tokyo (JP)

(72) Inventor: Hitoshi Tsuge, Tokyo (JP)

(73) Assignee: JOLED INC., Tokyo (JP)

( * ) Notice: Subject to any disclaimer, the term of this patent is extended or adjusted under 35 U.S.C. 154(b) by 9 days.

(21) Appl. No.: 15/031,023

(22) PCT Filed: Aug. 21, 2014

(86) PCT No.: PCT/JP2014/004300
§ 371 (c)(1),
(2) Date: Apr. 21, 2016

(87) PCT Pub. No.: WO2015/063988
PCT Pub. Date: May 7, 2015

(65) Prior Publication Data
US 2016/0267845 A1    Sep. 15, 2016

(30) Foreign Application Priority Data
Oct. 30, 2013   (JP) ................. 2013-225964

(51) Int. Cl.
*G09G 3/3258* (2016.01)
*G09G 3/3233* (2016.01)
*H01L 27/32* (2006.01)

(52) U.S. Cl.
CPC ........ *G09G 3/3258* (2013.01); *G09G 3/3233* (2013.01); *G09G 2300/0819* (2013.01); *G09G 2300/0842* (2013.01); *G09G 2300/0861* (2013.01); *G09G 2310/0256* (2013.01); *G09G 2320/0238* (2013.01);
(Continued)

(58) Field of Classification Search
CPC .............. G09G 3/3233; G09G 3/3258; G09G 2300/0819; G09G 2300/0842; G09G 2300/0861; G09G 2320/0626; G09G 2320/0238; G09G 2310/0256; G09G 2330/027; H01L 27/3244; H01L 2251/568
See application file for complete search history.

(56) References Cited

U.S. PATENT DOCUMENTS 6,621,489 B2   9/2003   Yanagisawa et al.
8,228,271 B2   7/2012   Hirai et al.
8,717,275 B2   5/2014   Masui
(Continued)

FOREIGN PATENT DOCUMENTS

JP   2001-249320   9/2001
JP   2009-104104   5/2009
(Continued)

OTHER PUBLICATIONS

International Search Report, dated Nov. 25, 2014, in corresponding International Application No. PCT/JP2014/004300.

*Primary Examiner* — Christopher E Leiby
(74) *Attorney, Agent, or Firm* — Greenblum & Bernstein, P.L.C.

(57) ABSTRACT

A method for powering off a display apparatus includes: detecting a power-off operation input to a display apparatus; upon detection of the power-off operation, setting capacitive elements of a plurality of pixel circuits so as to have a black-level voltage; and stopping supply of power to a display panel immediately after the voltage is set.

7 Claims, 13 Drawing Sheets

(52) U.S. Cl.
CPC .............. *G09G 2320/0626* (2013.01); *G09G 2330/027* (2013.01); *H01L 27/3244* (2013.01); *H01L 2251/568* (2013.01)

(56) References Cited

U.S. PATENT DOCUMENTS

| | | |
|---|---|---|
| 9,047,823 B2 | 6/2015 | Kim et al. |
| 2001/0020928 A1 | 9/2001 | Yanagisawa et al. |
| 2003/0071804 A1* | 4/2003 | Yamazaki ............ G09G 3/3233 345/204 |
| 2008/0297676 A1* | 12/2008 | Kimura ............... G02F 1/13624 349/39 |
| 2009/0160742 A1* | 6/2009 | Mizukoshi ........... G09G 3/3233 345/77 |
| 2009/0174629 A1 | 7/2009 | Lee |
| 2009/0201231 A1 | 8/2009 | Takahara et al. |
| 2010/0073265 A1 | 3/2010 | Hirai et al. |
| 2011/0115839 A1 | 5/2011 | Takahashi et al. |
| 2012/0127152 A1 | 5/2012 | Masui |
| 2014/0022289 A1* | 1/2014 | Lee ..................... G09G 3/3283 345/691 |
| 2014/0092144 A1* | 4/2014 | Kim ..................... G09G 3/3233 345/690 |
| 2016/0307499 A1* | 10/2016 | Toyomura ............ G09G 3/3233 |

FOREIGN PATENT DOCUMENTS

| | | |
|---|---|---|
| JP | 2009-163196 | 7/2009 |
| JP | 2009-271333 | 11/2009 |
| JP | 2009-276744 | 11/2009 |
| JP | 2011-141529 | 7/2011 |
| JP | 2012-113088 | 6/2012 |
| JP | 2013-210407 | 10/2013 |
| JP | 2014-071450 | 4/2014 |

\* cited by examiner

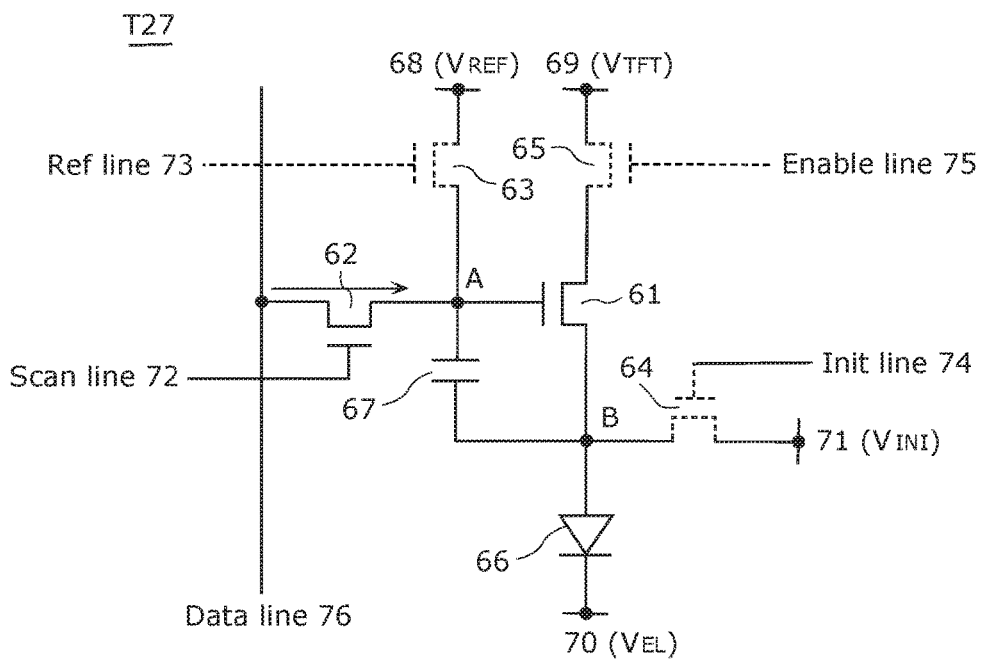

METHOD FOR POWERING OFF DISPLAY APPARATUS, AND DISPLAY APPARATUS

TECHNICAL FIELD

The present disclosure relates to a method for powering off a display apparatus, and a display apparatus. More particularly, the present disclosure relates to a method for powering off a display apparatus that uses a light-emitting element that emits light according to the amount of current, and a display apparatus.

BACKGROUND ART

In recent years, attention has been given to organic EL displays that use organic EL (Electro Luminescence) as a next-generation flat panel display that will replace liquid crystal displays. An active matrix display apparatus such as an organic EL display uses a thin-film transistor (TFT) as a driving transistor.

CITATION LIST

Patent Literature

[PTL 1] Japanese Unexamined Patent Application Publication No. 2009-104104

SUMMARY OF INVENTION

Technical Problem

Patent Literature (PTL) 1 discloses that a thin-film transistor undergoes a shift in characteristics over time. With an oxide thin-film transistor, the threshold voltage (the gate-to-source voltage at the time of transition between on and off) tends to shift due to an electric stress such as the application of current. The shift in the threshold voltage over time causes a variation in the amount of current supplied to an organic EL light-emitting element, which affects brightness control for the display apparatus and causes a problem of degrading the display quality.

The present disclosure has been made in view of the problem described above, and provides a method for powering off a display apparatus with which a shift in the threshold voltage of a driving transistor is suppressed, and a display apparatus.

Solution to Problem

In view of the above problem, a power-off method for a display apparatus according to the present disclosure is a method for powering off a display apparatus including a display panel having a plurality of pixel circuits arranged in rows and columns. Each of the plurality of pixel circuits includes: a light-emitting element that emits light according to the amount of current supplied; a driving transistor that supplies a current to the light-emitting element; and a capacitive element that is connected to the gate of the driving transistor and stores a brightness voltage. The method for powering off a display apparatus includes: detecting a power-off operation input to the display apparatus; upon detection of the power-off operation, setting the capacitive elements of the plurality of pixel circuits so as to have a black-level voltage; and stopping supply of power to the display panel immediately after the black-level voltage is set.

A display apparatus according to the present disclosure is a display apparatus including a display panel having a plurality of pixel circuits arranged in rows and columns, each of the plurality of pixel circuits including: a light-emitting element that emits light according to the amount of current supplied; a driving transistor that supplies a current to the light-emitting element; and a capacitive element that is connected to the gate of the driving transistor and stores a brightness voltage, the display apparatus including: a control unit configured to, upon detection of a power-off operation, set the capacitive elements of the plurality of pixel circuits so as to have a black-level voltage; and a power supply unit configured to stop supply of power to the display panel immediately after the black-level voltage is set.

Advantageous Effects of Invention

With the method for powering off a display apparatus and the display apparatus according to the present disclosure, it is possible to suppress a shift in the threshold voltage of a driving transistor during power-off period of the display apparatus.

BRIEF DESCRIPTION OF DRAWINGS

FIG. 6G is an illustrative diagram showing an operation of the pixel circuit during a period T27 shown in FIG. 5.

FIG. 6H is an illustrative diagram showing an operation of the pixel circuit during a period T28 shown in FIG. 7.

Figure 1:
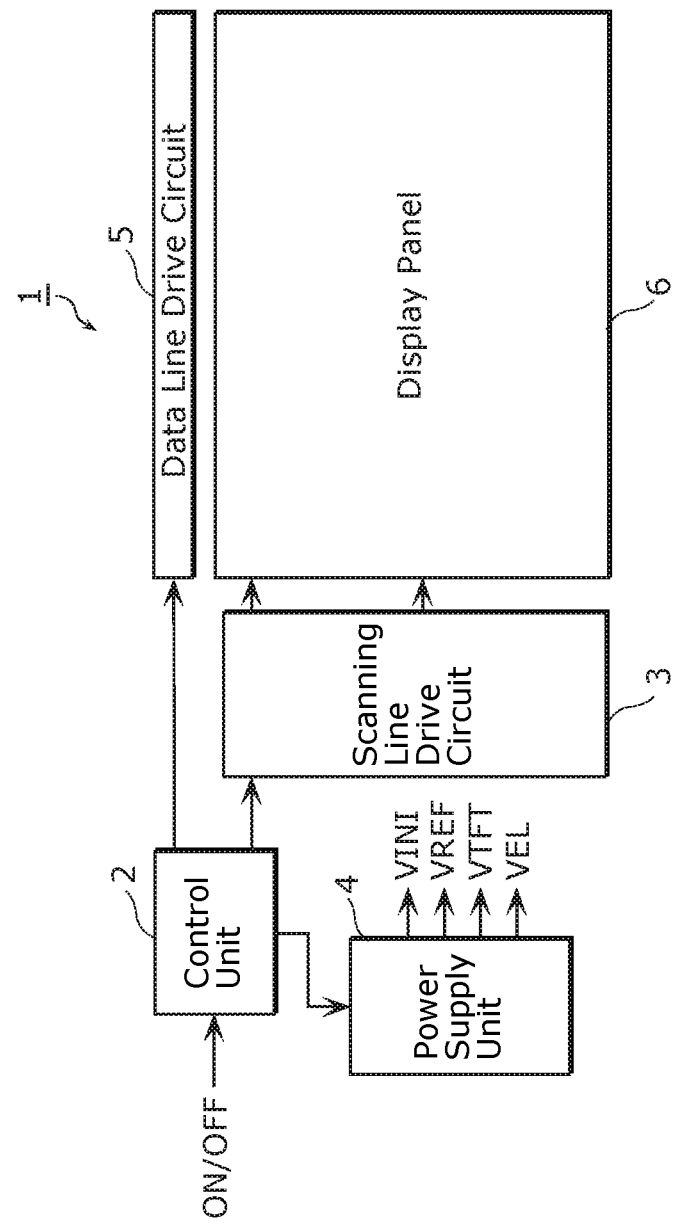
FIG. 1 is a block diagram showing an example of a configuration of a display apparatus according to an embodiment.

DESCRIPTION OF EMBODIMENTS (Underlying Knowledge Forming Basis of the Present Invention)

Hereinafter, the underlying knowledge forming the basis of the present disclosure will be described before a detailed description of the present disclosure is presented.

A thin-film transistor, which has high electron mobility, is usually used as a driving transistor in the pixels of an active matrix display apparatus. Each pixel of the display apparatus includes a capacitive element that stores a brightness voltage, and the capacitive element is connected to the gate of a driving transistor. By application of the brightness voltage to the gate of the driving transistor, the driving transistor supplies a current corresponding to the brightness value to an organic EL element (light-emitting element). Upon receiving the supplied current, the light-emitting element emits light in an amount corresponding to the current value.

An oxide thin-film transistor used as the driving transistor described above is advantageous in that it has a very small leak current while it is off, which is as small as a magnitude of pA order.

Regarding the very small leak current, the present inventors have found the following problems. To be specific, because of the leak current being very small, even when the display apparatus is powered off, the brightness voltage immediately before the power is turned off is stored in each pixel over several days, and the voltage may be applied to the driving transistor. As a result, despite the fact that the display apparatus is powered off, an electric stress is applied to the driving transistor for several days, causing a shift in the threshold voltage.

As described above, there is a problem in that the threshold voltage of the driving transistor shifts even while the organic EL display apparatus is in a power-off period. The shift in the threshold voltage varies depending on the type of oxide thin-film transistor, and, for example, in the case where the driving transistor has a plus threshold voltage, the shift in the threshold voltage becomes more prominent as the plus bias stress applied between the gate and the source becomes larger.

In addition, a shift in the threshold voltage that corresponds to a display pattern immediately before the display apparatus is powered off is generated, making the variation in the amount of shift in the threshold voltage between different pixels non-uniform or increasing the variation, and degrading the image quality.

Based on the finding described above, the method for powering off a display apparatus according to the present disclosure is designed such that upon detection of a power-off operation input to the display apparatus, a voltage for suppressing an electric stress applied to the driving transistor is set, and the supply of power to the display panel is stopped immediately after the voltage is set. As used herein, the voltage that suppresses an electric stress refers to, to be specific, a black-level voltage. The black-level voltage is a voltage that represents the darkest (in other words, black) in the brightness gradation that can be generated by a light-emitting element. As noted above, the shift in the threshold voltage becomes more prominent as the plus bias stress applied between the gate and the source becomes larger, and thus by causing the black-level voltage to remain applied to the gate of the driving transistor, the electric stress applied to the driving transistor can be suppressed.

Accordingly, because the electric stress applied to the driving transistor is suppressed during power-off period of the display apparatus, the shift in the threshold voltage of the driving transistor can be suppressed.

Hereinafter, embodiments will be described specifically with reference to the accompanying drawings.

Each of the embodiments described below shows a general or specific example. The numerical values, shapes, materials, structural elements, the arrangement and connection of the structural elements, steps, the processing order of the steps etc. shown in the following embodiments are mere examples, and therefore do not limit the scope of the claims. Also, among the structural elements in the following embodiments, structural elements not recited in any one of the independent claims are described as arbitrary structural elements.

Embodiments

Hereinafter, a method for powering off a display apparatus and a display apparatus according to the present disclosure will be described with reference to the drawings.

[1-1. Configuration of Display Apparatus]

The present embodiment will be described for the case where an organic EL element is used as a light-emitting element included in a display apparatus according to one aspect of the present disclosure with reference to FIGS. 1 and 2.

FIG. 1 is a block diagram showing an example of a configuration of a display apparatus according to an embodiment. FIG. 2 is a circuit diagram showing an example of a configuration of one of pixel circuits that are two-dimensionally arranged on a display panel shown in FIG. 1.

A display apparatus 1 shown in FIG. 1 includes a control unit 2, a scanning line drive circuit 3, a power supply unit 4, a data line drive circuit 5, and a display panel 6.

The display panel 6 is, for example, an organic EL panel. The display panel 6 includes at least N (for example, N=1080) scanning lines that are arranged in parallel to each other, N lighting control lines, and M orthogonally arranged source signal lines. Furthermore, the display panel 6 includes a pixel circuit at each intersection of a source signal line and a scanning line, the pixel circuit including a thin-film transistor and an EL element. Hereinafter, the pixel circuits arranged on the same scanning line will be referred to as "display line". In other words, the display panel 6 has a configuration in which N display lines, each including M EL elements, are arranged.

The control unit 2 controls an operation for each frame during normal display when the display apparatus is powered on and a power-off sequence operation when a power-off operation is detected. A characteristic operation of the present disclosure is that when a power-off operation to power off the display apparatus is detected, the control unit 2 transfers control from the normal display operation to the power-off sequence operation. In the power-off sequence, the control unit 2 sets a voltage for suppressing an electric stress applied to the driving transistor of each pixel circuit, and controls the power supply unit 4 so as to stop the supply of power to the display panel 6 immediately after the voltage is set.

During normal display, the control unit 2 generates a first control signal for controlling the data line drive circuit 5 based on a display data signal, and outputs the generated first control signal to the data line drive circuit 5. Also, the control unit 2 generates a second control signal for controlling the scanning line drive circuit 3 based on an input synchronization signal, and outputs the generated second control signal to the scanning line drive circuit 3.

As used herein, the display data signal refers to a signal indicating display data including an image signal, a vertical synchronization signal and a horizontal synchronization signal. The image signal is a signal that specifies each pixel value, which is gradation information, for each frame. The vertical synchronization signal is a signal for synchronizing a processing timing in the vertical direction on the screen, and in the present embodiment, is a signal used as a reference for the processing timing for each frame. The horizontal synchronization signal is a signal for synchronizing a processing timing in the horizontal direction on the screen, and in the present embodiment, is a signal used as a reference for the processing timing for each display line.

The first control signal includes the image signal and the horizontal synchronization signal. The second control signal includes the vertical synchronization signal and the horizontal synchronization signal.

The power supply unit 4 supplies power to each of the control unit 2, the scanning line drive circuit 3 and the display panel 6, and also supplies various types of voltages to the display panel 6. As used herein, the various types of voltages refer to, in an example of a pixel circuit shown in FIG. 2, $V_{INI}$, $V_{REF}$, $V_{TFT}$ and $V_{EL}$, and these voltages are supplied to each pixel circuit via an initialization power supply line 71, a reference voltage power supply line 68, an EL anode power supply line 69 and an EL cathode power supply line 70, respectively.

The data line drive circuit 5 drives the source signal lines (Data line 76 in FIG. 2) of the display panel 6 based on the first control signal generated by the control unit 2. To be more specific, the data line drive circuit 5 outputs a source signal to each pixel circuit based on the image signal and the horizontal synchronization signal.

The scanning line drive circuit 3 drives the scanning lines of the display panel 6 based on the second control signal generated by the control unit 2. To be more specific, the scanning line drive circuit 3 outputs, based on the vertical synchronization signal and the horizontal synchronization signal, a scanning signal, a REF signal, an enable signal and an init signal to each pixel circuit, the signals being output at least for each display line. In the pixel circuit example shown in FIG. 2, the scanning signal, the REF signal, the enable signal and the init signal are output to Scan line 72, Ref line 73, Enable line 75 and Init line 74, and are used to control the switches to which these lines are connected so as to be on and off.

The display apparatus 1 has a configuration as described above.

Although not illustrated in the diagrams, the display apparatus 1 may include, for example, a CPU (Central Processing Unit), a storage medium such as a ROM (Read Only Memory) in which a control program is stored, a work memory such as a RAM (Random Access Memory), and a communication circuit. For example, a display data signal S1 is generated by, for example, the CPU executing the control program.

A configuration of a pixel circuit shown in FIG. 2 will be described next.

Figure 2:
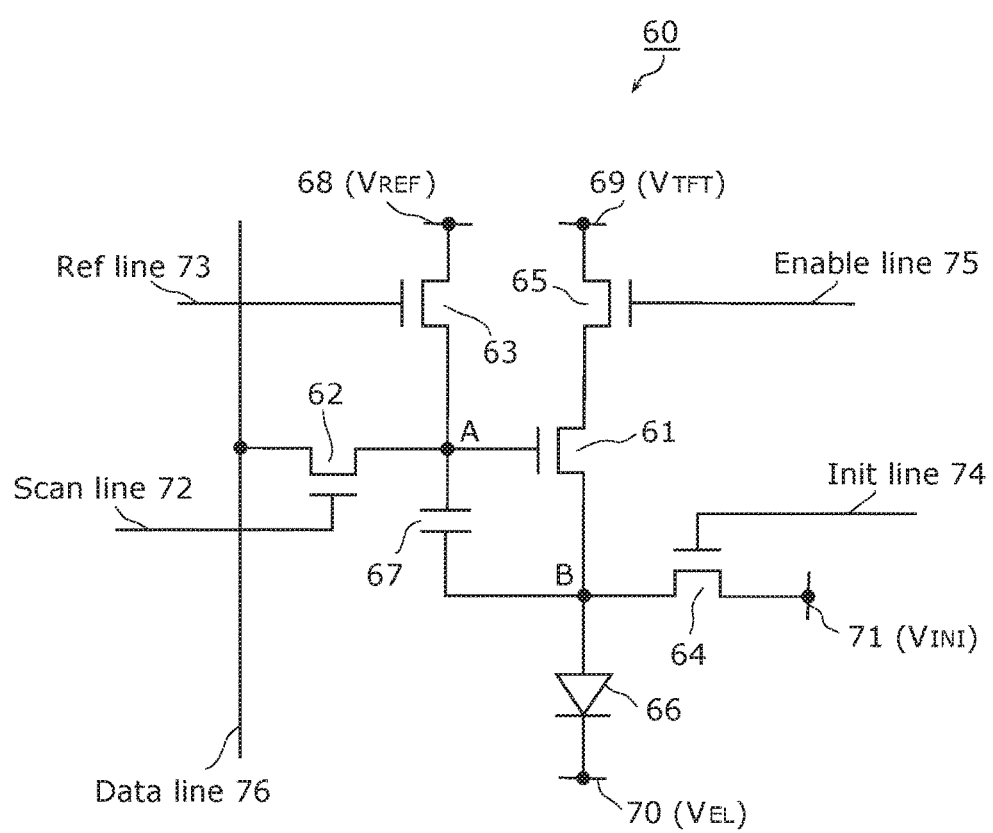
FIG. 2 is a circuit diagram showing an example of a configuration of one of pixel circuits that are two-dimensionally arranged on a display panel shown in FIG. 1 according to the embodiment.

A pixel circuit 60 shown in FIG. 2 is one of the pixels included in the display panel 6, and has a function of emitting light in an amount corresponding to a data signal (data signal voltage) supplied via Data line 76 (data line).

The pixel circuit 60 is an example of a display pixel (light-emitting pixel), and a plurality of pixel circuits are arranged in rows and columns. The pixel circuit 60 includes a driving transistor 61, a switch 62, a switch 63, a switch 64, an enable switch 65, an EL element 66, and a capacitive element 67. The pixel circuit 60 also includes the Data line 76 (data line), the reference voltage power supply line 68 ($V_{REF}$), the EL anode power supply line 69 ($V_{TFT}$), the EL cathode power supply line 70 ($V_{EL}$), and the initialization power supply line 71 ($V_{INI}$).

The Data line 76 is an example of a signal line (source signal line) for supplying a data signal voltage.

The reference voltage power supply line 68 ($V_{REF}$) is a power supply line that supplies a reference voltage $V_{REF}$ that defines the voltage value of a first electrode of the capacitive element 67. The EL anode power supply line 69 ($V_{TFT}$) is a high-voltage side power supply line for determining the potential of a drain electrode of the driving transistor 61. The EL cathode power supply line 70 ($V_{EL}$) is a low-voltage side power supply line that is connected to a second electrode (cathode) of the EL element 66. The initialization power supply line 71 ($V_{INI}$) is a power supply line for initializing the source-to-gate voltage of the driving transistor 61, or in other words, the voltage of the capacitive element 67.

The EL element 66 is an example of a light-emitting element, and a plurality of EL elements are arranged in rows and columns. The EL element 66 has a light-emitting period during which a drive current is passed therethrough to emit light, and a non light-emitting period during which a drive current is not passed therethrough and thus light is not emitted. To be specific, the EL element 66 emits light in an amount corresponding to the amount of current supplied from the driving transistor 61. The EL element 66 is, for example, an organic EL element. In the EL element 66, its cathode (second electrode) is connected to the EL cathode power supply line 70, and its anode (first electrode) is connected to the source (source electrode) of the driving transistor 61. The voltage supplied to the EL cathode power supply line 70 is represented by $V_{EL}$, and may be, for example, 0 (v).

The driving transistor 61 is a driving element for driving a voltage for controlling the amount of current supplied to the EL element 66, and causes a current (drive current) to flow through the EL element 66 so as to cause the EL element 66 to emit light. To be specific, in the driving transistor 61, its gate electrode is connected to the first electrode of the capacitive element 67, and its source electrode is connected to the second electrode of the capacitive element 67 and the anode of the EL element 66.

When the switch 63 is switched to an off state (non-conducting state) so as not to electrically connect the reference voltage power supply line 68 and the first electrode of the capacitive element 67, and the enable switch 65 is switched to an on state (conducting state) so as to electrically connect the EL anode power supply line 69 and the drain electrode, the driving transistor 61 causes a drive current, which is a current corresponding to the data signal voltage to flow through the EL element 66 so as to cause the EL element 66 to emit light. The voltage supplied to the EL anode power supply line 69 is represented by $V_{TFT}$, and may be, for example, 20 V. By doing so, the driving transistor 61 converts the data signal voltage (data signal) supplied to the gate electrode to a signal current corresponding to the data signal voltage (data signal), and supplies the signal current obtained by the conversion to the EL element 66.

Also, when the switch 63 is switched to an off state (non-conducting state) so as not to electrically connect the reference voltage power supply line 68 and the first electrode of the capacitive element 67, and the enable switch 65 is switched to an off state (non-conducting state) so as not to electrically connect the EL anode power supply line 69 and the drain electrode, the driving transistor 61 does cause the EL element 66 to emit light by not causing the drive current to flow through the EL element 66.

Furthermore, the threshold voltage of the driving transistor 61 may vary from pixel circuit to pixel circuit due to a shift in the threshold voltage over time. The influence of the variation can be suppressed by a threshold voltage compensation operation. The threshold compensation operation is, to be brief, an operation of setting, in the capacitive element 67 of each pixel circuit, a voltage corresponding to the threshold voltage of the corresponding driving transistor 61. A detailed description of this operation will be given later.

The capacitive element 67 is an example of a storage capacitor for storing a voltage, and stores a voltage that determines the amount of current flowing through the driving transistor 61. To be specific, the second electrode (electrode provided on node B side) of the capacitive element 67 is connected between the source (the EL cathode power supply line 70 side) of the driving transistor 61 and the anode (first electrode) of the EL element 66. The first electrode (electrode provided on node A side) of the capacitive element 67 is connected to the gate of the driving transistor 61. Also, the first electrode of the capacitive element 67 is connected to the reference voltage power supply line 68 ($V_{REF}$) via the switch 63.

The switch 62 performs switching between a conducting state and a non-conducting state between the Data line 76 (signal line) for supplying the data signal voltage and the first electrode of the capacitive element 67. To be specific, the switch 62 is a switching transistor in which one terminal of the drain and the source is connected to the Data line 76, the other terminal of the drain and the source is connected to the first electrode of the capacitive element 67, and the gate is connected to the Scan line 72, which is a scanning line. To rephrase it, the switch 62 has a function of writing, into the capacitive element 67, a data signal voltage (data signal) corresponding to an image signal voltage (image signal) supplied via the Data line 76.

The switch 63 performs switching between a conducting state and a non-conducting state between the reference voltage power supply line 68 for supplying the reference voltage $V_{REF}$ and the first electrode of the capacitive element 67. To be specific, the switch 63 is a switching transistor in which one terminal of the drain and the source is connected to the reference voltage power supply line 68 ($V_{REF}$), the other terminal of the drain and the source is connected to the first electrode of the capacitive element 67, and the gate is connected to the Ref line 73. To rephrase it, the switch 63 has a function of providing the reference voltage ($V_{REF}$) to the first electrode of the capacitive element 67 (the gate of the driving transistor 61).

The switch 64 performs switching between a conducting state and a non-conducting state between the second electrode of the capacitive element 67 and the initialization power supply line 71. To be specific, the switch 64 is a switching transistor in which one terminal of the drain and the source is connected to the initialization power supply line 71 ($V_{INI}$), the other terminal of the drain and the source is connected to the second electrode of the capacitive element 67, and the gate is connected to the Init line 74. To rephrase it, the switch 64 has a function of providing the initialization voltage ($V_{INI}$) to the second electrode of the capacitive element 67 (the source of the driving transistor 61).

The enable switch 65 performs switching between a conducting state and a non-conducting state between the EL anode power supply line 69 and the drain electrode of the driving transistor 61. To be specific, the enable switch 65 is a switching transistor in which one terminal of the drain and the source is connected to the EL anode power supply line 69 ($V_{TFT}$), the other terminal of the drain and the source is connected to the drain electrode of the driving transistor 61, and the gate is connected to the Enable line 75.

The pixel circuit 60 has a configuration as described above.

The following description will be given assuming that the switches 62 to 64 and the enable switch 65 constituting the pixel circuit 60 are n-type TFTs, but the present embodiment is not limited thereto. The switches 62 to 64 and the enable switch 65 may be p-type TFTs. Alternatively, as the switches 62 to 64 and the enable switch 65, n-type TFTs and p-type TFTs may be used in combination. With respect to a signal line connected to the gate of a p-type TFT, a voltage level, which will be described below, may be reversed.

Also, the switches 62 to 64 and the enable switch 65 constituting the pixel circuit 60 are preferably switching transistors made of an oxide semiconductor such as a transparent amorphous oxide semiconductor (TAOS). A transistor including a channel layer made of TAOS has high electron mobility, is suitable for use as a switching transistor, and has a feature in that it has a very small leak current while it is off.

Also, the potential difference between the voltage $V_{REF}$ of the reference voltage power supply line 68 and the voltage $V_{INI}$ of the initialization power supply line 71 is set to a voltage larger than the maximum threshold voltage of the driving transistor 61.

Also, the voltage $V_{REF}$ of the reference voltage power supply line 68 and the voltage $V_{INI}$ of the initialization power supply line 71 are set as follows so as to prevent a current from flowing through the EL element 66.

Voltage $V_{INI}$<Voltage $V_{EL}$+(Forward current threshold voltage of EL element 66), (Voltage $V_{REF}$ of reference voltage power supply line 68)<Voltage $V_{EL}$+(Forward current threshold voltage of EL element 66)+(Threshold voltage of driving transistor 61)

The voltage $V_{EL}$ is, as described above, the voltage of the EL cathode power supply line 70.

[1-2. Operations of Display Apparatus]

Operations performed by the display apparatus configured as shown in FIGS. 1 and 2 will be described next with reference to FIGS. 3 and 4.

Figure 3:
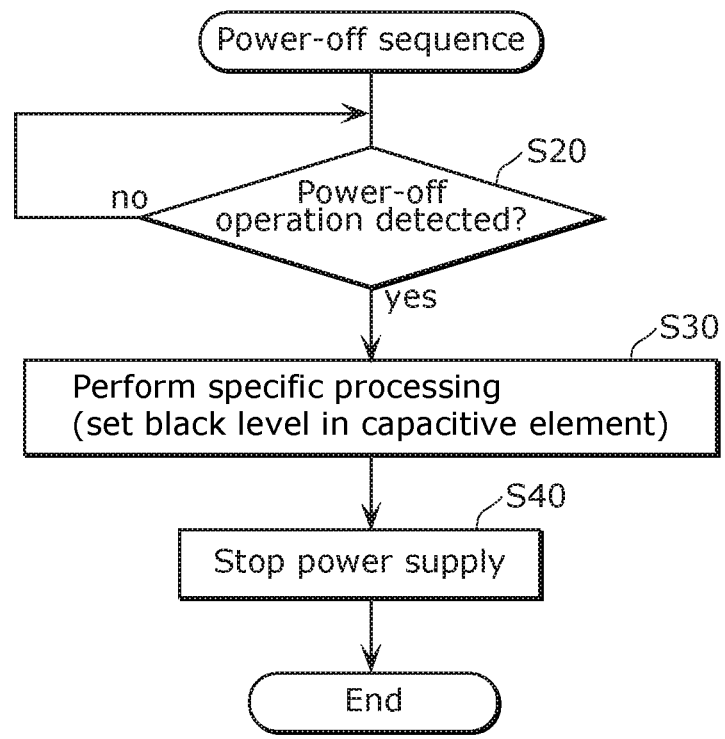
FIG. 3 is a flowchart illustrating a method for powering off a display apparatus according to the embodiment.

FIG. 3 is a flowchart illustrating a method for powering off a display apparatus according to an embodiment. FIG. 4 is a time chart showing a normal display operation and a power-off sequence performed immediately before the display apparatus is powered down, which are performed in the display apparatus according to the embodiment.

A power-off sequence operation (power-off method) will be described first before a description of a normal display operation is presented.

As shown in FIG. 3, the control unit 2 detects a power-off operation input into the display apparatus 1 (S20). The power-off operation as used herein encompasses, for example, pressing of a power button on a remote controller by the user, pressing of a power button on the body of the display apparatus 1, arrival of off-time by an off-timer setting set by the user, elapse of a set time set by a timer that times a duration during which no operation is performed by the user, and a drop in the AC power supply voltage in the event of a power failure. Also, as shown in FIG. 4, upon detection of the power-off operation, the control unit 2 transfers control from a normal display operation to the power-off sequence operation.

Upon detection of the power-off operation, the control unit 2 performs specific processing, to be specific, sets a voltage for suppressing an electric stress applied to the driving transistor 61 in the capacitive elements 67 of all pixel circuits 60 (S30). For example, the voltage for suppressing the electric stress is written into the pixel circuits 60 in each line while display lines are sequentially scanned in the same manner as in normal display, and scanning is stopped when writing of the voltage into the pixel circuits 60 in the final line has finished and scanning has been performed on all lines (in other words, the processing does not return to the first line). As described above, the voltage for suppressing the electric stress is, to be specific, a black-level voltage. This is because the shift in the threshold voltage of the driving transistor is suppressed while the black-level voltage is applied to the gate of the driving transistor.

Furthermore, immediately after the voltage has been set, the power supply unit 4 stops, under control of the control unit 2, the supply of power to the display panel 6, the scanning line drive circuit 3 and the data line drive circuit 5 (S40). In response thereto, the display apparatus 1 is powered off.

The setting of the voltage in step S30 described above can be performed as follows, for example. To be specific, upon detection of the power-off operation, the control unit 2 first causes each of the capacitive elements 67 of a plurality of pixel circuits 60 to store a first voltage that is higher than the threshold voltage of the driving transistor 61 and that does not cause the EL elements 66 to emit light. This operation is performed by a rising edge of INI signal (Init line 74) and a rising edge of REF signal (reference voltage power supply line 68) in the power-off sequence shown in FIG. 4.

Hereinafter, operations performed in the power-off sequence shown in FIG. 4 will be described in further detail.

Figure 4:
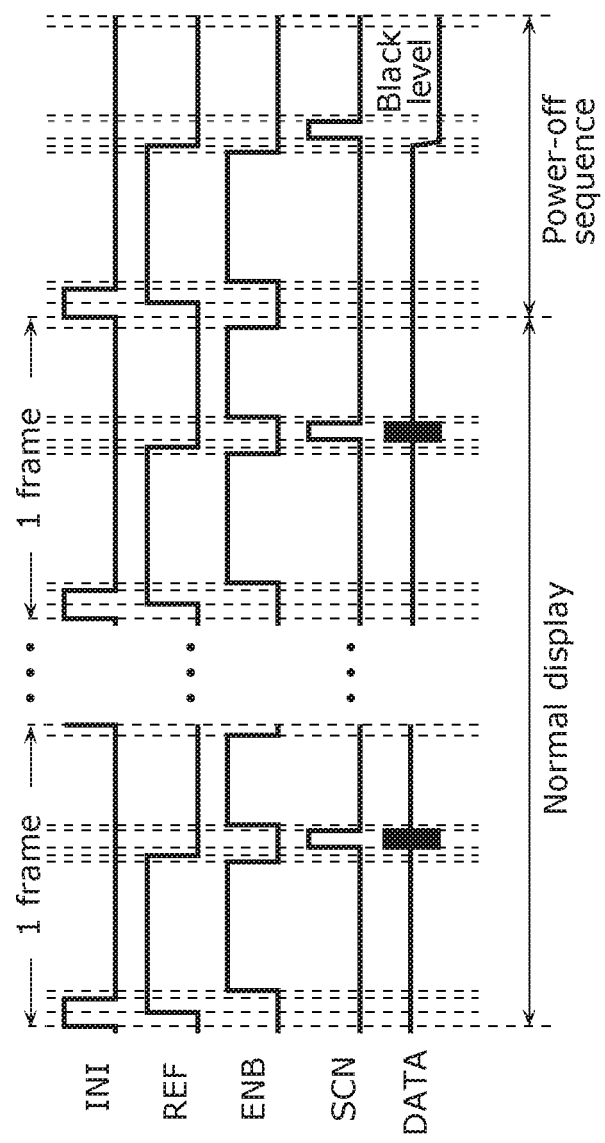
FIG. 4 is a time chart showing a normal display operation and a power-off sequence performed immediately before the display apparatus is powered down, which are performed in the display apparatus according to the embodiment.
Figure 5:
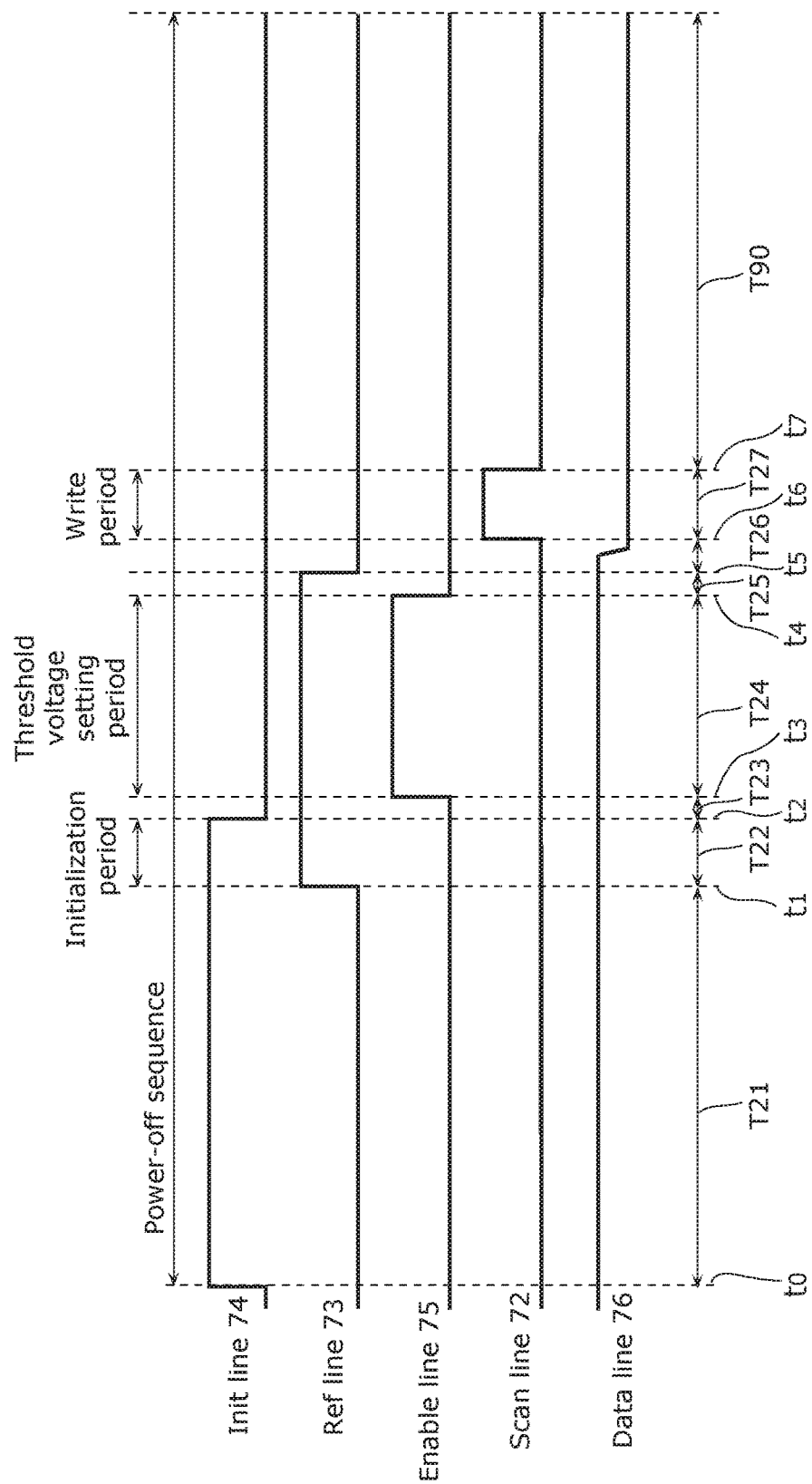
FIG. 5 is a time chart showing, in detail, examples of timings in the power-off sequence shown in FIG. 4.

FIG. 5 is a time chart showing, in detail, examples of timings in the power-off sequence shown in FIG. 4. FIGS. 6A to 6G are illustrative diagrams showing operations of a pixel circuit 60 performed during periods T21 to T27 shown in FIG. 5. The operations of the pixel circuit 60 performed during periods T21 to T25 in the power-off sequence shown in FIG. 5 are the same as those performed during periods T21 to T25 in "1 frame" shown in FIG. 7 showing an example of a time chart of normal display. As will be described below, at the end of period T25, in each pixel circuit 60, a voltage corresponding to the threshold voltage of the driving transistor 61 is stored in the capacitive element 67 and applied to the gate. Furthermore, setting of the black level in the capacitive element 67 is performed in this state during periods T26 and T27 shown in FIG. 5.

(Period T21)

Period T21 between time t0 and time t1 shown in FIG. 5 is a period during which only the switch 64 is switched to a conducting state so as to stabilize the potential of the node B (the potential of the node B is set to the voltage $V_{INI}$ of the initialization power supply line 71).

Figure 6A:
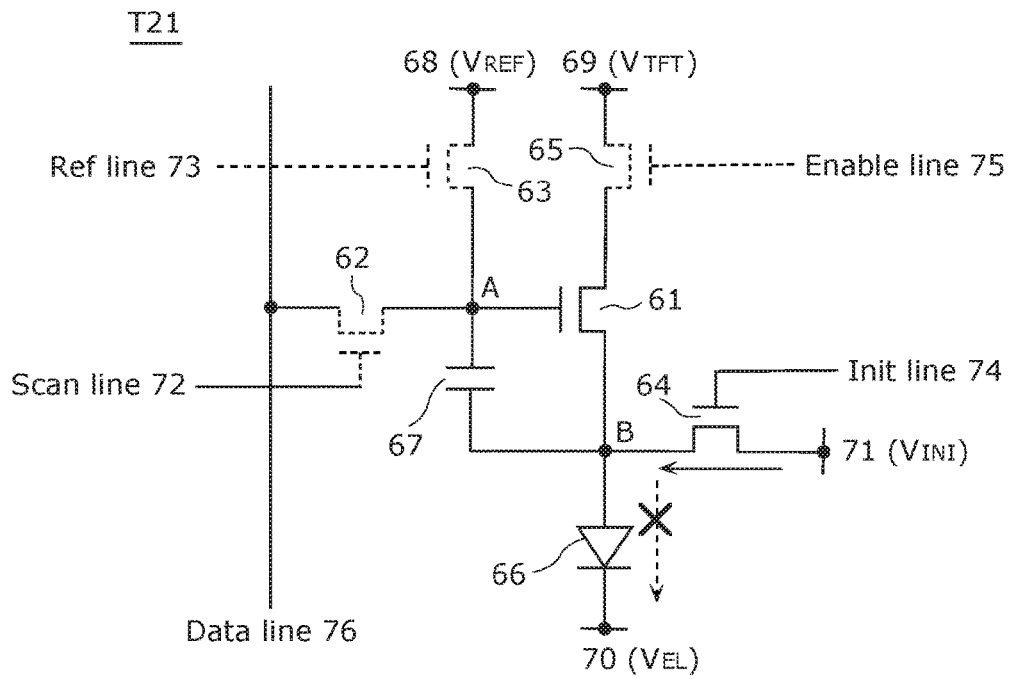
FIG. 6A is an illustrative diagram showing an operation of a pixel circuit during a period T21 shown in FIG. 5.
Figure 7:
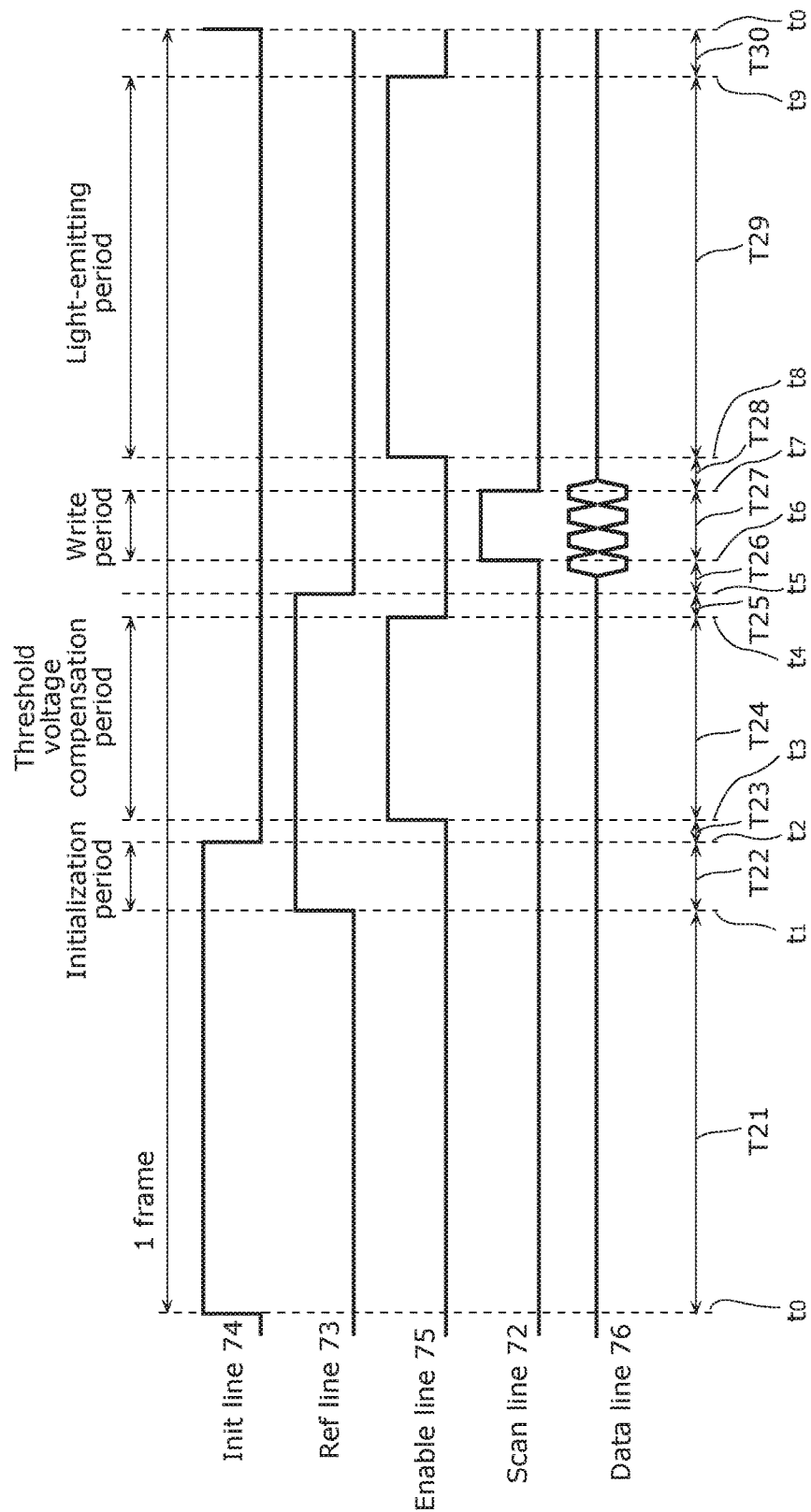
FIG. 7 is a time chart showing, in detail, examples of timings in the normal display operation shown in FIG. 4.

To be more specific, as shown in an operation state of a pixel circuit 60 shown in FIG. 6A, at time t0, the scanning line drive circuit 3 changes the voltage level of the Init line 74 from LOW to HIGH while maintaining the voltage levels of the Scan line 72, the Ref line 73 and the Enable line 75 at LOW. In other words, at time t0, the switch 64 is switched to a conducting state (on state) while the switch 62, the switch 63 and the enable switch 65 remain in a non-conducting state (off state).

As described above, by providing the period T21 during which only the switch 64 among the switch 62, the switch 63, the switch 64 and the enable switch 65 is switched to a conducting state by the operation of the Init line 74, the potential of the node B can be set to the voltage $V_{INI}$ of the initialization power supply line 71.

The reason that the period T21 is provided is as follows.

If the display panel 6 constituting the display apparatus 1 is large in size, or the size of each pixel (pixel circuit 60) is large, the capacitance of the EL element 66 increases, which increases the wiring time constant of the initialization power supply line 71, as a result of which it takes time to bring the voltage of the node B to the voltage $V_{INI}$ of the initialization power supply line 71. To address this, by providing the period T21 during which the switch 64 is first switched to a conducting state, it is possible to more reliably set the potential of the node B to the voltage $V_{INI}$ of the initialization power supply line 71.

It also takes time to apply the voltage $V_{REF}$ of the reference voltage power supply line 68 to the node A. However, it is the capacitive element 67 and the wiring time constant of the reference voltage power supply line 68 for which charging and discharging of the voltage $V_{REF}$ is performed. In other words, the wiring time constant of the reference voltage power supply line 68 and the wiring time constant of the initialization power supply line 71 are approximately equal, but the capacitance of the EL element 66 is greater than that of the capacitive element 67, and the capacitance ratio: (EL element 66)/(Capacitive element 67) is 1.3 to 9. For this reason, it takes more time to charge the EL element 66 (write the voltage $V_{INI}$ of the initialization power supply line 71 into the potential of the node B) than to charge the capacitive element 67 (write the voltage $V_{REF}$ of the reference voltage power supply line 68 into the potential of the node A).

Also, the following advantage is obtained by switching only the switch 64 to a conducting state during the period T21 and delaying the conduction of the switch 63.

To be specific, during the period T21, by providing a period during which the voltage $V_{INI}$ of the initialization power supply line 71 is written into the potential of the node B, it is possible to obtain an advantage in that the load of writing the voltage $V_{REF}$ of the reference voltage power supply line 68 into the node A can be reduced. In other words, by providing the period T21, the voltage of the node A can be set to a low voltage, and the reference voltage power supply line 68 only needs to supply a current (voltage) for charging the pixel circuit 60. To rephrase it, the voltage $V_{REF}$ of the reference voltage power supply line 68 is not used as the voltage for charging the EL element 66, and it is therefore possible to obtain an advantage in that the load of the reference voltage power supply line 68 can be reduced.

As described above, the period T21 during which only the switch 64 is switched to a conducting state (on state) so as to first determine the potential of the node B is provided. As a result, it is possible to shorten the total time of a period T22 subsequent to the period T21 while reducing the power consumption of the display panel 6 and the influence of variation in the brightness of the display panel 6.

(Period T22: Initialization Period)

Period T22 between time t1 and time t2 shown in FIG. 5 is an initialization period during which an initial voltage required to flow a drain current for performing the threshold voltage compensation operation of the driving transistor 61 is stored in the capacitive element 67 and applied between the source and the gate of the driving transistor 61.

Figure 6B:
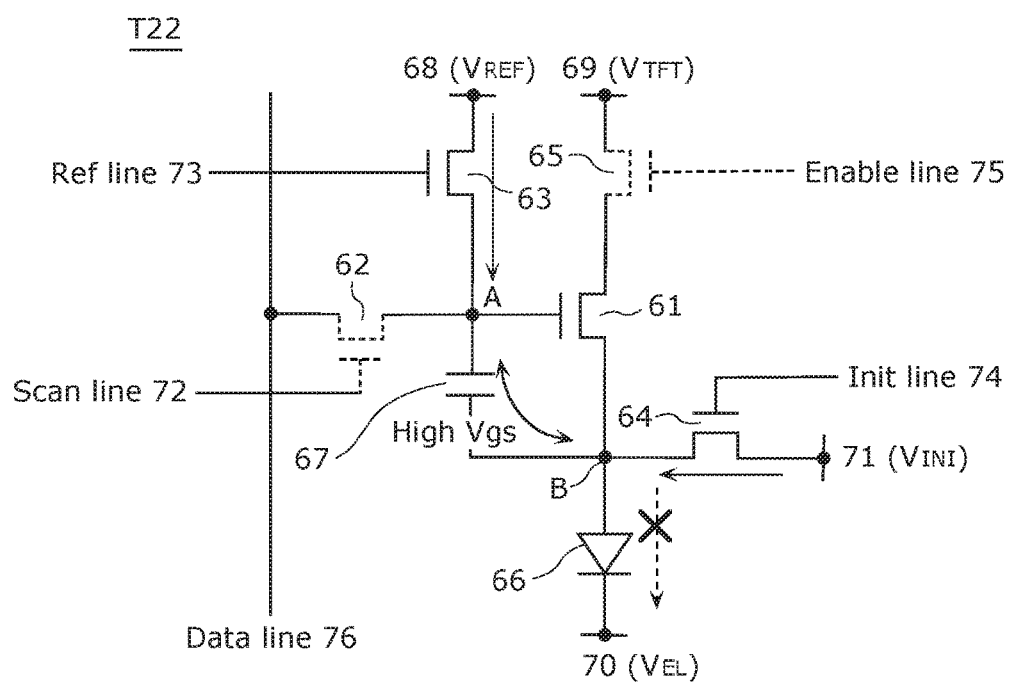
FIG. 6B is an illustrative diagram showing an operation of the pixel circuit during a period T22 shown in FIG. 5.

To be specific, as shown in an operation state of the pixel circuit 60 shown in FIG. 6B, at time t1, the scanning line drive circuit 3 changes the voltage level of the Ref line 73 from LOW to HIGH while maintaining the voltage levels of the Scan line 72 and the Enable line 75 at LOW and maintaining the voltage level of the Init line 74 at HIGH. In other words, at time t1, the switch 63 is switched to a conducting state (on state) while the switch 62 and the enable switch 65 remain in the non-conducting state (off state), and the switch 64 remains in the conducting state (on state).

By doing so, the potential of the node A is set to the voltage $V_{REF}$ of the reference voltage power supply line 68. Here, the switch 64 is in the conducting state, and thus the potential of the node B is set to the voltage $V_{INI}$ of the initialization power supply line 71. In other words, the voltage $V_{REF}$ of the reference voltage power supply line 68 and the voltage $V_{INI}$ of the initialization power supply line 71 are applied to the driving transistor 61.

The period T22 is set to a length (duration) required for the potentials of the nodes A and B to reach predetermined potentials.

Also, as described above, the gate-to-source voltage of the driving transistor 61 needs to be set to an initial voltage that can ensure an initial drain current required to perform the threshold compensation operation. In other words, the initial voltage needs to be a voltage that is higher than the threshold voltage of the driving transistor 61 and that does not cause the EL element 66 to emit light. For this reason, the potential difference between the voltage $V_{REF}$ of the reference voltage power supply line 68 and the voltage $V_{INI}$ of the initialization power supply line 71 is set to a voltage larger than the maximum threshold voltage of the driving transistor 61. Also, the voltage $V_{REF}$ and the voltage $V_{INI}$ are set so as to respectively satisfy: Voltage $V_{INI}$<Voltage $V_{EL}$+Forward current threshold voltage of EL element 66; and $V_{REF}$<Voltage $V_{EL}$+Forward current threshold voltage of EL element 66+Threshold voltage of driving transistor 61, so as to prevent a current from flowing through the EL element 66.

(Period T23)

Period T23 between time t2 and time t3 shown in FIG. 5 is a period for preventing the switch 64 and the enable switch 65 from simultaneously being in a conducting state.

Figure 6C:
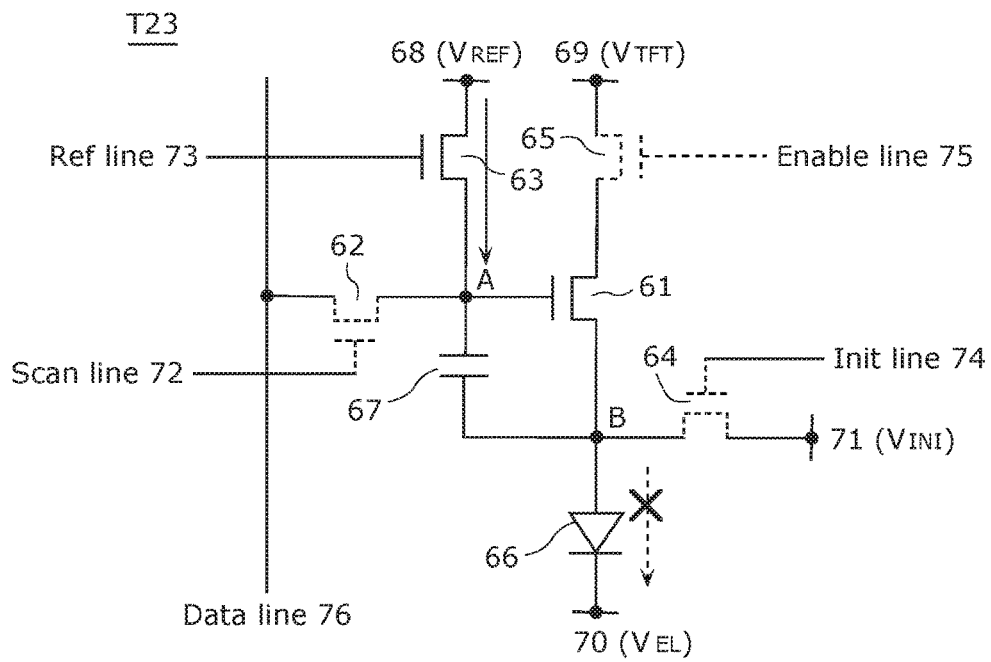
FIG. 6C is an illustrative diagram showing an operation of the pixel circuit during a period T23 shown in FIG. 5.

To be more specific, as shown in an operation state of the pixel circuit 60 shown in FIG. 6C, at time t2, the scanning line drive circuit 3 changes the voltage level of the Init line 74 from HIGH to LOW while maintaining the voltage levels of the Scan line 72 and the Enable line 75 at LOW and maintaining the voltage level of the Ref line 73 at HIGH. In other words, at time t2, the switch 64 is switched to a non-conducting state (off state) while the switch 62 and the enable switch 65 remain in the non-conducting state (off state) and the switch 63 remains in the conducting state (on state).

As described above, by providing the period T23 during which the switch 64 is switched to a non-conducting state by the operation of the Init line 74, it is possible to prevent a situation, that would occur if the period T23 is not provided, in which both the switch 64 and the enable switch 65 are simultaneously in a conducting state, causing a through-current to flow between the EL anode power supply line 69 and the initialization power supply line 71 via the enable switch 65, the driving transistor 61 and the switch 64.

(Period T24: Threshold Setting Period/Threshold Compensation Period)

Next, period T24 between time t3 and time t4 shown in FIG. 5 is a threshold setting period for compensating a variation in the threshold voltages of the driving transistors 61 of a plurality of pixel circuits 60. In other words, the period T24 is a period during which, even if the threshold voltages of the driving transistors 61 of a plurality of pixel circuits 60 vary, a voltage corresponding to the threshold voltage of each individual driving transistor 61 is set in the corresponding capacitive element 67.

In the power-off sequence shown in FIG. 5 and the normal display sequence shown in FIG. 7, the periods T21 to T25 are the same, but because the power-off sequence and the normal display sequence have different purposes, the period T24 is referred to as "threshold setting period" in FIG. 5, and "threshold compensation period" in FIG. 7. The threshold setting period of FIG. 5 and the threshold compensation period in the normal display of FIG. 7 are different in that the threshold setting period of FIG. 5 is provided for the purpose of defining the voltage of the capacitive element 67 after the display apparatus 1 is powered off, whereas the threshold compensation period in the normal display of FIG. 7 is provided for the purpose of suppressing a situation in which the brightness voltage and is written in the capacitive element 67 after the period T25 deviates from the correct value due to the variation of the threshold voltage by an amount of shift in the threshold voltage.

Figure 6D:
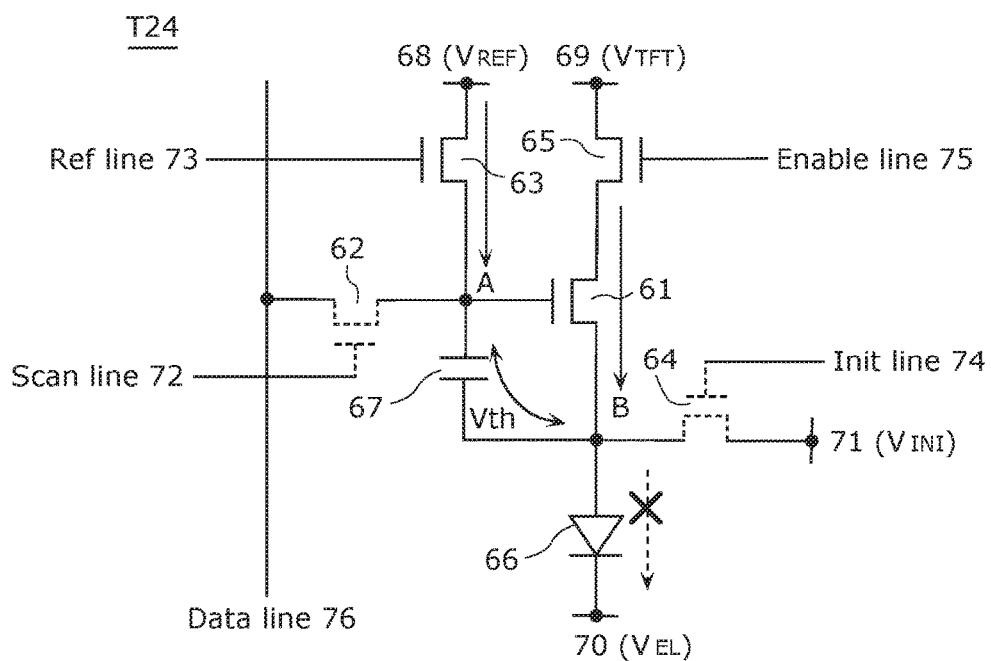
FIG. 6D is an illustrative diagram showing an operation of the pixel circuit during a period T24 shown in FIG. 5.

In the period T24, as shown in an operation state of the pixel circuit 60 shown in FIG. 6D, at time t3, the scanning line drive circuit 3 changes the voltage level of the Enable line 75 from LOW to HIGH while maintaining the voltage levels of the Scan line 72 and the Init line 74 at LOW, and maintaining the voltage level of the Ref line 73 at HIGH. In other words, at time t3, the enable switch 65 is switched to a conducting state (on state) while the switch 62 and the switch 64 are maintained in the non-conducting state (off state) and the switch 63 is maintained in the conducting state (on state).

As described above, the voltage of the capacitive element 67 was set to the initial voltage during the initialization period (period T22), and thus no current flows through the EL element 66. The driving transistor 61 receives supply of a drain current by the voltage $V_{TFT}$ of the EL anode power supply line 69, and the source potential of the driving transistor 61 changes accordingly. To rephrase it, in the driving transistor 61, the source potential of the driving transistor 61 changes until the drain current supplied by the voltage $V_{TFT}$ of the EL anode power supply line 69 reaches 0.

In this way, by switching the enable switch 65 to a conducting state (on state) while the voltage $V_{REF}$ of the reference voltage power supply line 68 is input to the gate electrode of the driving transistor 61, the threshold compensation operation of the driving transistor 61 can be started.

Then, at the end of the period T24 (time t4), the potential difference between the node A and the node B (the gate-to-source voltage of the driving transistor 61) is equal to a potential difference corresponding to the threshold of the driving transistor 61, and the voltage is stored in the capacitive element 67.

(Period T25)

Period T25 between time t4 and time t5 shown in FIG. 5 is a period for causing the threshold compensation operation to end.

Figure 6E:
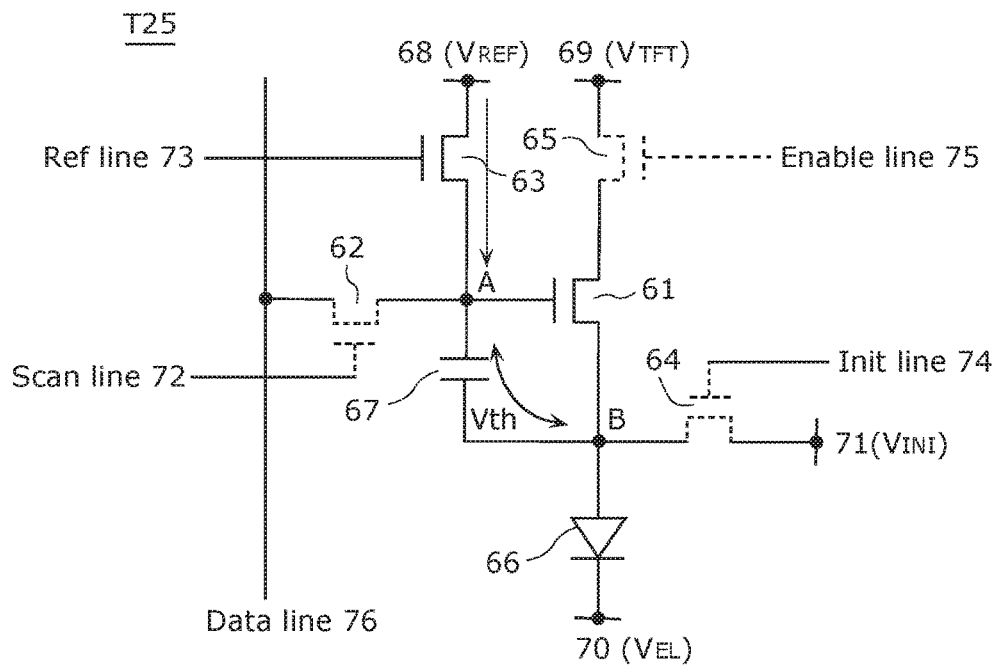
FIG. 6E is an illustrative diagram showing an operation of the pixel circuit during a period T25 shown in FIG. 5.

To be more specific, as shown in an operation state of the pixel circuit 60 shown in FIG. 6E, the scanning line drive circuit 3 changes the voltage level of the Enable line 75 from HIGH to LOW while maintaining the voltage levels of the Scan line 72 and the Init line 74 at LOW and the voltage level of the Ref line 73 at HIGH. In other words, at time t4, the enable switch 65 is switched to a non-conducting state (off state) while the switch 62 and the switch 64 are maintained in the non-conducting state (off state), and the switch 63 is maintained in the conducting state (on state).

In this way, by providing the period T25 during which the enable switch 65 is switched to a non-conducting state by the operation of the Enable line 75, the supply of current from the EL anode power supply line 69 to the node B via the driving transistor 61 can be stopped, and the next operation can be performed after the threshold compensation operation is completely ended.

As described above, at time t5 at which the period T25 ends, each of the capacitive elements 67 of a plurality of pixel circuits 60 stores a voltage corresponding to the threshold voltage of the corresponding driving transistor 61.

(Period T26)

At periods T26 and T27, a black level corresponding to the threshold voltage of each individual driving transistor 61 is further set from the state of the period T25.

To be specific, period T26 between time t5 and time t6 shown in FIG. 5 is a period for preventing the data signal voltage supplied via the Data line 76 and the voltage $V_{REF}$ of the reference voltage power supply line 68 from being applied simultaneously to the node A by switching the switch 63 to a non-conducting state (off state).

Figure 6F:
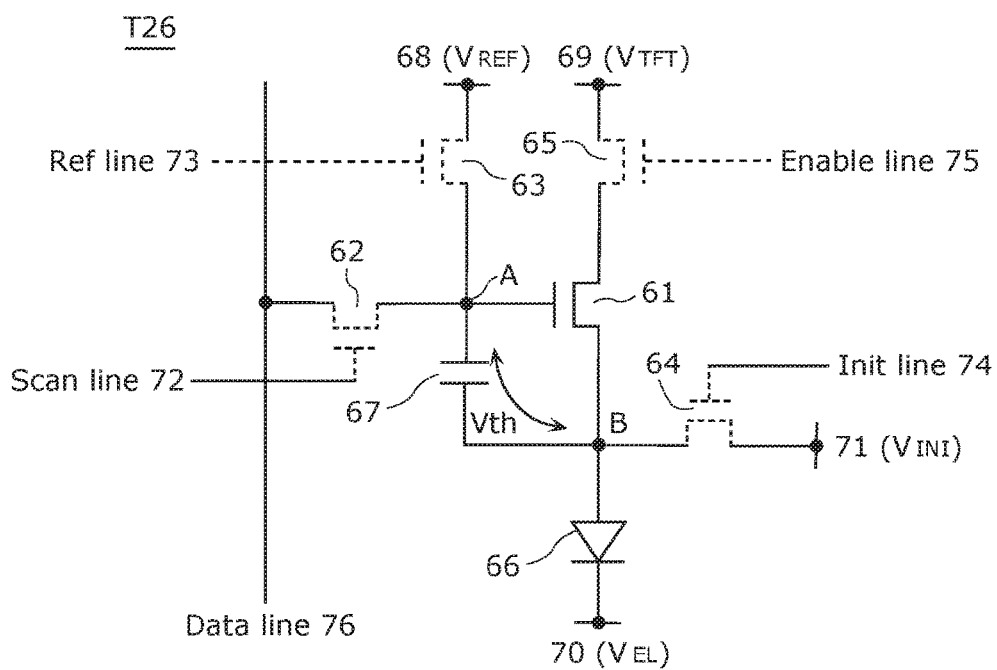
FIG. 6F is an illustrative diagram showing an operation of the pixel circuit during a period T26 shown in FIG. 5.

To be specific, as shown in an operation state of the pixel circuit 60 shown in FIG. 6F, at time t5, the scanning line drive circuit 3 changes the voltage level of the Ref line 73 from HIGH to LOW while the voltage levels of the Scan line 72, the Init line 74 and the Enable line 75 are maintained at LOW. In other words, at time t5, the switch 63 is switched to a non-conducting state (off state) while the switch 62, the switch 64 and the enable switch 65 remain in the non-conducting state (off state).

In this way, by providing the period T26 during which the switch 63 is further switched to a non-conducting state by the operation of the Ref line 73 so as to bring the switch 62 and the switch 63 into a non-conducting state (off state), simultaneous application of the data signal voltage (the black-level voltage) supplied from the switch 62 via the Data line 76 and the voltage $V_{REF}$ of the reference voltage power supply line 68 to the node A is prevented.

Also, as shown in FIG. 6F (FIG. 2), the enable switch 65 connected to the Enable line 75 is connected on the drain side of the driving transistor 61. In the case where the enable switch 65 is an n-type transistor, the ON resistance of the enable switch 65 is likely to be high, and a voltage drop caused by the ON resistance affects the power consumption of the display panel 6. For this reason, the ON resistance of the enable switch 65 is reduced as much as possible at the time of forming. As the method for reducing ON resistance, a method such as increasing the channel size of the enable switch 65, or increasing the ON control voltage of the Enable line 75 is generally known, but either method will increase the fall time of the Enable line 75.

To address this, in the present embodiment, by providing the period T25 during which the Enable line 75 is caused to fall prior to the Ref line 73, it is possible to shorten the period during which the voltage of the node A is unstable, or namely, the fall time.

(Period T27: Write Period)

The next period, period T27 between time t6 and time t7 shown in FIG. 5 is a write period during which a black-level image signal voltage (data signal voltage) having a low level in the display gradation, is input from the Data line 76 to the pixel circuit 60 via the switch 62 and is written into the capacitive element 67.

To be specific, as shown in an operation state of the pixel circuit 60 shown in FIG. 6G, at time t6, the scanning line drive circuit 3 changes the voltage level of the Scan line 72 from LOW to HIGH while maintaining the Init line 74, the Ref line 73 and the Enable line 75 at LOW. In other words, at time t6, the switch 62 is switched to a conducting state (on state) while the switch 63, the switch 64 and the enable switch 65 are maintained in the non-conducting state (off state).

By doing so, the voltage difference between the black-level image signal voltage and the voltage $V_{REF}$ of the reference voltage power supply line 68 is increased by a factor of (Capacitance of EL element 66)/(Capacitance of EL element 66+Capacitance of capacitive element 67), and stored (held) in the capacitive element 67, in addition to the threshold voltage $V_{th}$ of the driving transistor 61 stored during the threshold compensation period. Since the enable switch 65 is in the non-conducting state, the driving transistor 61 does not allow the drain current to flow. Accordingly, the potential of the node B does not undergo a significant change during the period T27.

In this way, during the period T27 (write period), a voltage corresponding to the threshold voltage of the driving transistor 61, which is a black-level data signal voltage (image signal voltage), is set in the capacitive element 67.

(Period T90)

At any time during a period T90 that starts after time t5 shown in FIG. 5, under control of the control unit 2, the power supply unit 4 stops the supply of power to the display panel 6, the scanning line drive circuit 3, the data line drive circuit 5 and the like. By doing so, the display apparatus 1 is powered off.

As a result, while the display apparatus 1 is powered off, the capacitive element 67 stores the black-level voltage, or in other words, the black-level voltage is applied to the gate of the driving transistor 61. In this state, an electric stress applied to the driving transistor is suppressed.

In addition, even if there is a variation in the threshold voltages of the driving transistors 61 of a plurality of pixel circuits 60, in each individual pixel circuit 60, a voltage obtained by adding the black-level voltage to the voltage corresponding to the threshold voltage of the corresponding driving transistor 61 is stored in the capacitive element 67. In other words, the black level voltage corresponding to the threshold voltage of each individual driving transistor 61 in which a shift in the threshold voltage has occurred is stored in the corresponding capacitive element 67. Accordingly, it is possible to obtain an advantageous effect of suppressing the shift in the threshold voltage while the display apparatus 1 is powered off, and suppressing a variation, if any, in the threshold voltages of the driving transistors 61.

Next is a description of a display operation for each frame during normal display shown in FIG. 4.

FIG. 7 is a time chart showing, in detail, examples of timings in the normal display operation shown in FIG. 4. FIGS. 6A to 6H are illustrative diagrams showing operations of a pixel circuit 60 during periods T21 to T30 shown in FIG. 7.

Periods T21 to T25 shown in FIG. 7 are the same as periods T21 to T25 shown in FIG. 5, which were already described above. Here, operations performed after a period T26 will be described.

(Period T26)

Period T26 between time t5 and time t6 shown in FIG. 7 is a period for preventing the data signal voltage supplied via the Data line 76 and the voltage $V_{REF}$ of the reference voltage power supply line 68 from being applied simultaneously to the node A by switching the switch 63 to a non-conducting state (off state).

To be specific, as shown in an operation state of the pixel circuit 60 shown in FIG. 6F, at time t5, the scanning line drive circuit 3 changes the voltage level of the Ref line 73 from HIGH to LOW while maintaining the voltage levels of the Scan line 72, the Init line 74 and the Enable line 75 at LOW. In other words, at time t5, the switch 63 is switched to a non-conducting state (off state) while the switch 62, the switch 64 and the enable switch 65 remain in the non-conducting state (off state).

In this way, by providing the period T26 during which the switch 63 is further switched to a non-conducting state by the operation of the Ref line 73 so as to bring the switch 62 and the switch 63 into a non-conducting state (off state), simultaneous application of the data signal voltage (image signal voltage) supplied from the switch 62 via the Data line 76 and the voltage $V_{REF}$ of the reference voltage power supply line 68 to the node A is prevented.

Also, as shown in FIG. 6F (FIG. 2), the enable switch 65 connected to the Enable line 75 is connected to the drain side of the driving transistor 61. In the case where the enable switch 65 is an n-type transistor, the ON resistance of the enable switch 65 is likely to be high, and a voltage drop caused by the ON resistance affects the power consumption of the display panel 6. For this reason, the ON resistance of the enable switch 65 is reduced as much as possible at the time of forming. As the method for reducing ON resistance, a method such as increasing the channel size of the enable switch 65, or increasing the ON control voltage of the Enable line 75 is generally known, but either method will increase the fall time of the Enable line 75.

To address this, in the present embodiment, by providing the period T25 during which the Enable line 75 is caused to fall prior to the Ref line 73, it is possible to shorten the period during which the voltage of the node A is unstable, or namely, the fall time.

(Period T27: Write Period)

The next period, period T27 between time t6 and time t7 shown in FIG. 7 is a write period during which an image signal voltage (data signal voltage) corresponding to the display gradation is input from the Data line 76 to the pixel circuit 60 via the switch 62 and is written into the capacitive element 67.

To be specific, as shown in an operation state of the pixel circuit 60 shown in FIG. 6G, at time t6, the scanning line drive circuit 3 changes the voltage level of the Scan line 72 from LOW to HIGH while maintaining the voltage levels of the Init line 74, the Ref line 73 and the Enable line 75 at LOW. In other words, at time t6, the switch 62 is switched to a conducting state (on state) while the switch 63, the switch 64 and the enable switch 65 are maintained in the non-conducting state (off state).

By doing so, the voltage difference between the image signal voltage and the voltage $V_{REF}$ of the reference voltage power supply line 68 is increased by a factor of (Capacitance of EL element 66)/(Capacitance of EL element 66+Capacitance of capacitive element 67), and stored (held) in the capacitive element 67, in addition to the threshold voltage $V_{th}$ of the driving transistor 61 stored during the threshold compensation period. Since the enable switch 65 is in the non-conducting state, the driving transistor 61 does not allow the drain current to flow. Accordingly, the potential of the node B does not undergo a significant change during the period T27.

Along with an increase in the screen size (increase in the size of the display panel 6) and an increase in the number of pixel circuits 60, the period for writing an image signal into each pixel circuit 60 (horizontal scanning period) is reduced. The wiring time constant of the Scan line 72 also increases along with the increase in the screen size, and thus the increased wiring time constant combined with the reduction of the horizontal scanning period makes it difficult to write a predetermined gradation voltage into the pixel circuit 60.

To address this, in the present embodiment, as shown in FIG. 7, in order to input the image signal (data signal voltage) within a limited time, the period during which the switch 62 is in the conducting state (period T27) is increased. Also, in the present embodiment, even when the Scan line 72 has a round waveform, the Scan line 72 has been caused to rise before a predetermined image signal (data signal voltage) is input into the Data line 76, so as to switch the switch 62 to a conducting state (on state). This is done so to prevent the occurrence of a large variation in the potential of the node B during the period T27.

In this way, during the period T27 (write period), the data signal voltage (image signal voltage) and the voltage corresponding to the threshold voltage of the driving transistor 61 are stored (held) in the capacitive element 67.

(Period T28)

Period T28 between time t7 and time t8 shown in FIG. 7 is a period for reliably switching the switch 62 to a non-conducting state.

To be more specific, as shown in an operation state of the pixel circuit 60 shown in FIG. 6H, at time t7, the scanning line drive circuit 3 changes the voltage level of the Scan line 72 from HIGH to LOW while maintaining the voltage levels of the Ref line 73, the Init line 74 and the Enable line 75 at LOW. In other words, at time t7, the switch 62 is switched to a non-conducting state (off state) while the switch 63, the switch 64 and the enable switch 65 remain in the non-conducting state (off state).

By doing so, in the subsequent period, period T29 (light-emitting period), the switch 62 can be reliably switched to a non-conducting state (off state) before the enable switch 65 is switched to a conducting state (on state).

If, in the absence of the period T28, the enable switch 65 and the switch 62 are simultaneously in a conducting state (on state), the potential of the node B increases due to the drain current of the driving transistor 61, whereas the potential of the node A is set to the data signal voltage, and thus the source-to-gate voltage of the driving transistor 61 decreases. In this case, a problem arises in that light having a brightness lower than a desired brightness is emitted. In order to prevent this, in the present embodiment, the period T28 is provided so as to ensure that the switch 62 is in a non-conducting state, and in the subsequent period, period T29, the enable switch 65 is switched to a conducting state.

(Period T29: Light-Emitting Period)

The next period, period T29 between time t8 and time t9 shown in FIG. 7 is a light-emitting period.

To be specific, at time t8, the scanning line drive circuit 3 changes the voltage level of the Enable line 75 from LOW to HIGH while maintaining the voltage levels of the Scan line 72, the Ref line 73 and the Init line 74 at LOW. In other words, at time t8, the enable switch 65 is switched to a conducting state (on state) while the switch 62, the switch 63 and the switch 64 are maintained in the non-conducting state (off state).

In this way, by switching the enable switch 65 to a conducting state (on state), it is possible to supply a current to the EL element 66 via the driving transistor 61 according to the voltage stored in the capacitive element 67 and cause the EL element 66 to emit light.

(Period T30)

Period T30 between time t9 and time t0 shown in FIG. 7 is a period in which all of the switches are brought into a non-conducting state so as to change the potentials of the nodes A and B to a voltage close to the voltage required in the period T21.

To be more specific, at time t9, the scanning line drive circuit 3 changes the voltage level of the Enable line 75 from HIGH to LOW while maintaining the voltage levels of the Scan line 72, the Ref line 73 and the Init line 74 at LOW. In other words, at time t9, the enable switch 65 is further switched to a non-conducting state (off state) while the switch 62, the switch 63 and the switch 64 remain in the non-conducting state (off state).

By providing the period T30 between periods T29 and T21 in this way, the potentials of the nodes A and B can be changed to a voltage close to the voltage required in the next period, period T21, without charging and discharging a current by the power supply lines.

The pixel circuit 60 performs normal display according to the sequence described above. The operations for normal display from the period T21 to the period T25 (threshold voltage compensation operation) shown in FIG. 7 are the same as those of the power-off sequence from the period T21 to the period T25 (threshold voltage setting operation) shown in FIG. 5, and a voltage corresponding to the threshold voltage of the driving transistor 61 is set in the capacitive element 67.

By doing so, during normal display shown in FIG. 7, it is possible to, even if there is a variation in the threshold voltage of the initialization power supply line 71 between pixel circuits 60, cause each EL element 66 to emit light in an amount corresponding to the data signal voltage (image signal voltage). On the other hand, in the power-off sequence shown in FIG. 5, it is possible to suppress an electric stress applied to the driving transistors 61 after the display apparatus 1 has been powered off.

The operations performed during the periods T21 to T25 shown in FIG. 7 are basically line-sequential operations that are performed for each display line of the display panel. However, the operations during the periods T21 to T25 shown in FIG. 5 may be line-sequential operations, or may be collective setting operations that are collectively performed for all display lines of the display panel at a time. In the collective setting operations, the capacitive elements 67 of a plurality of pixel circuits 60 of all display lines are simultaneously set so as to have a black-level voltage.

The power-off sequence shown in FIG. 5 may have the same length as or a different length from the period indicated by "1 frame" in FIG. 7. For example, in the case of the collective setting operations of the power-off sequence shown in FIG. 5, the influence of delay due to the floating capacitance of wiring becomes greater than the case of the line-sequential operations, but the length of the power-off sequence can be made shorter than the total length required to perform line-sequential operations on all pixel lines.

[1-3. Advantageous Effects, etc.]

As described above, one aspect of the method for turning off a display apparatus according to the present disclosure is a method for powering off a display apparatus including a display panel having a plurality of pixel circuits arranged in rows and columns, each of the plurality of pixel circuits including: a light-emitting element that emits light according to an amount of current supplied; a driving transistor that supplies a current to the light-emitting element; and a capacitive element that is connected to a gate of the driving transistor and stores a brightness voltage, the method for powering off a display apparatus including: detecting a power-off operation input to the display apparatus; upon detection of the power-off operation, setting the capacitive elements of the plurality of pixel circuits so as to have a black-level voltage; and stopping supply of power to the display panel immediately after the black-level voltage is set.

With this configuration, it is possible to suppress a shift in the threshold voltage of the driving transistor during power-off period of the display apparatus.

Also, in the setting of the voltage, the capacitive elements of the plurality of pixel circuits are collectively set at a time so as to have the black-level voltage.

With this configuration, the voltage is collectively set in the capacitive elements of all pixel circuits, and it is therefore possible to shorten the time required until the supply of power is stopped.

Also, the driving transistor may be an n-type thin-film transistor, and may supply a larger current to the light-emitting element for higher values of the voltage stored in the capacitive element, and the black-level voltage may be a minimum of the brightness voltage of the light-emitting element.

With this configuration, in the case where the driving transistor 61 is an n-type thin-film transistor, it is possible to suppress a shift in the threshold voltage of the driving transistor during power-off period.

Also, the driving transistor may be a p-type thin-film transistor, and may supply a smaller current to the light-emitting element for higher values of the voltage stored in the capacitive element, and the black-level voltage may be a maximum of the brightness voltage of the light-emitting element.

With this configuration, in the case where the driving transistor 61 is a p-type thin-film transistor, it is possible to suppress a shift in the threshold voltage of the driving transistor during power-off period.

Also, each of the plurality of pixel circuits may further include a switch connected to the capacitive element, and the switch may be a switching transistor made of an oxide semiconductor.

With this configuration, although a switching transistor made of an oxide semiconductor has a feature in that it has a very small leak current while it is off, it is possible to suppress a shift in the threshold voltage of the driving transistor during power-off period.

One aspect of the display apparatus according to the present disclosure is a display apparatus including a display panel having a plurality of pixel circuits arranged in rows and columns, each of the plurality of pixel circuits including: a light-emitting element that emits light according to an amount of current supplied; a driving transistor that supplies a current to the light-emitting element; and a capacitive element that is connected to a gate of the driving transistor and stores a brightness voltage, the display apparatus including: a control unit configured to, upon detection of a power-off operation, set the capacitive elements of the plurality of pixel circuits so as to have a black-level voltage; and a power supply unit configured to stop supply of power to the display panel immediately after the black-level voltage is set.

With this configuration, it is possible to suppress a shift in the threshold voltage of the driving transistor during power-off period of the display apparatus.

Also, each of the plurality of pixel circuits may further include a switch connected to the capacitive element, and the switch may be a switching transistor made of an oxide semiconductor.

With this configuration, although a switching transistor made of an oxide semiconductor has a feature in that it has a very small leak current while it is off, it is possible to suppress a shift in the threshold voltage of the driving transistor during power-off period.

(Variations)

In the foregoing, the embodiment has been described above as an example of the technique disclosed in the present application. However, the technique according to the present disclosure is not limited thereto, and is applicable to an embodiment obtained through changes, replacement, addition, omission and the like as appropriate. It is also possible to provide a new embodiment by combining the structural elements described in the embodiment described above.

Figure 8:
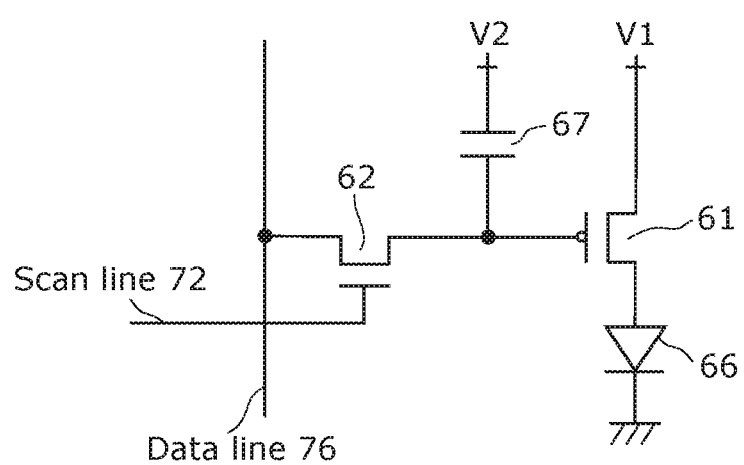
FIG. 8 is a diagram showing an example of a display pixel circuit according to a variation of the embodiment.

FIG. 8 is a diagram showing an example of a display pixel circuit according to a variation of the embodiment. The pixel circuit shown in FIG. 8 includes a driving transistor 61, a switch 62, an EL element 66 and a capacitive element 67, and thus has a configuration simpler than the pixel circuit shown in FIG. 2.

The driving transistor 61 shown in the diagram is a p-type TFT rather than an n-type TFT, and its drain is connected to a power supply line of voltage V1.

One of the electrodes of the capacitive element 67 is connected to a power supply line of voltage V2. The voltage V1 may be the same as the voltage V2.

One of the source and the drain of the switch 62 is connected to a Data line 76, and the other of the source and the drain is connected to the other electrode of the capacitive element 67. The gate of the switch 62 is connected to a Scan line 72.

In this configuration, in a power-off sequence, the potential of the Data line 76 is first set to a black-level potential. In this case, because the driving transistor 61 is a p-type TFT, the black-level potential is the maximum potential in the brightness voltage range. Next, the Scan line 72 is set to a high level (in other words, the switch 62 is turned on). By doing so, a voltage that presents the black level of the driving transistor 61 is stored in the capacitive element 67. The voltage stored in the capacitive element 67 is applied to the gate of the driving transistor 61. As a result, an electric stress applied to the driving transistor 61 is suppressed. Furthermore, in this state, the power supply unit 4 stops the supply of power to the display panel 6.

As described above, the configuration of the pixel circuit 60 is not limited to the example of the circuit shown in FIG. 2, and may be the example of the circuit shown in FIG. 8. It is possible to use a circuit configuration obtained by, for example, adding, to the example of the circuit shown in FIG. 8, a switch between the power supply line of voltage V1 and the driving transistor 61 and connecting an Enable line 75 to the gate of the switch. Also, it is possible to use a circuit configuration obtained by adding, to the example of the circuit shown in FIG. 8, a switch between the power supply line of voltage V2 and the driving transistor 61 and connecting a Ref line 73 to the gate of the switch. Also, it is possible to use a circuit configuration obtained by, in the example of the circuit shown in FIG. 8, connecting an initialization power supply line 71 to the anode of the EL element 66 via a switch and connecting an Init line 74 to the gate of the switch.

Also, the driving transistor 61 may be of n-type or p-type as in FIGS. 2 and 8.

When the driving transistor 61 is an n-type thin-film transistor, the driving transistor 61 supplies a larger current to the EL element 66 for higher values of the voltage stored in the capacitive element 67. The black-level voltage is the minimum of the brightness voltage of the EL element 66 (light-emitting element).

Alternatively, when the driving transistor 61 is a p-type thin-film transistor, the driving transistor 61 supplies a smaller current to the EL element 66 for higher values of the voltage stored in the capacitive element 67. The black-level voltage is the maximum of the brightness voltage of the EL element 66 (light-emitting element).

Other Embodiments

Another embodiment according to the present disclosure will be described next with reference to FIGS. 9 and 10. The configurations of a display apparatus and a pixel circuit according to this embodiment are the same as those shown in FIGS. 1 and 2. Also, a power-off method and a time chart of this embodiment are the same as those shown in FIGS. 3 and 4.

Figure 9:
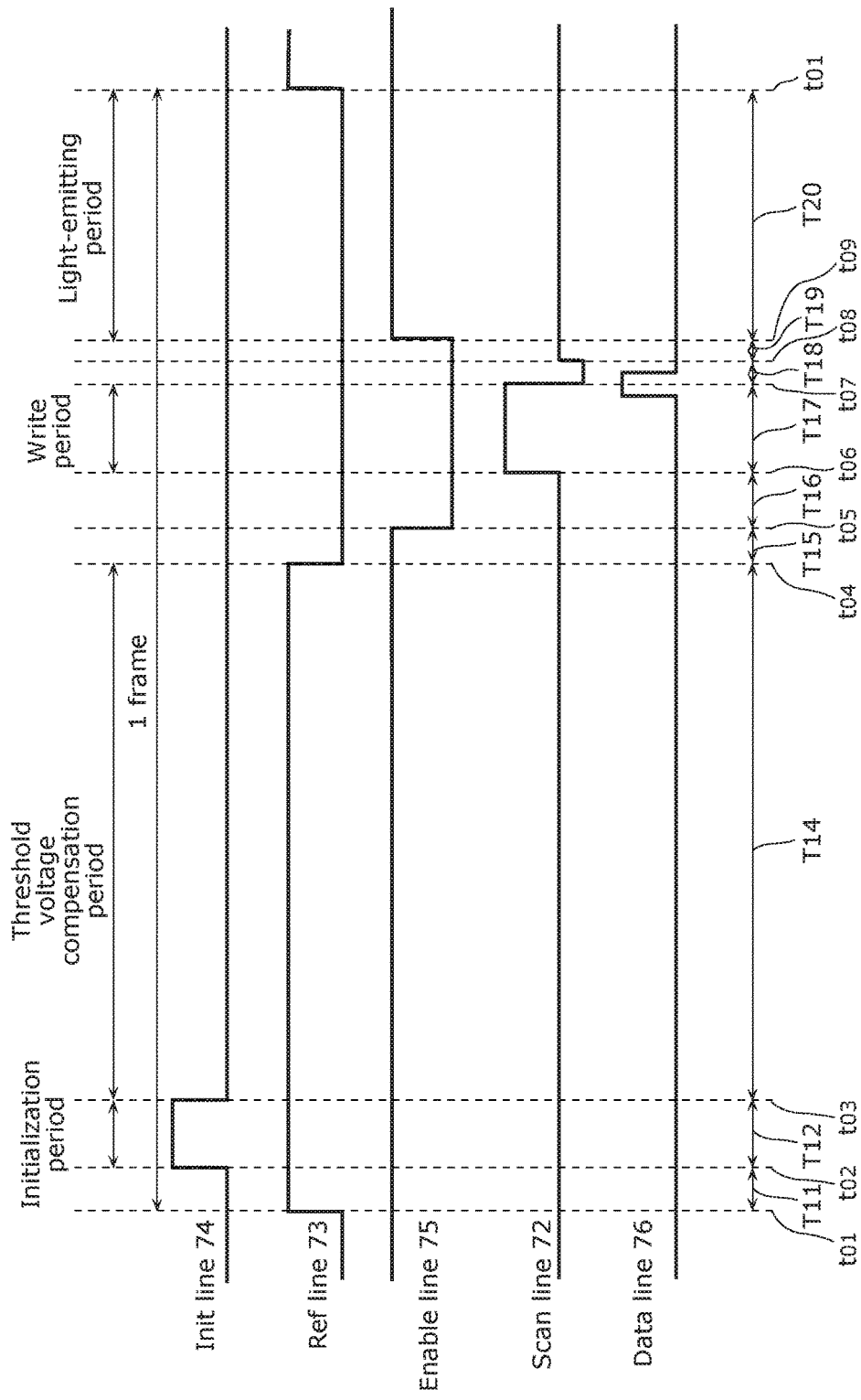
FIG. 9 is a time chart showing, in detail, examples of timings in a normal display operation according to another embodiment.
Figure 10:
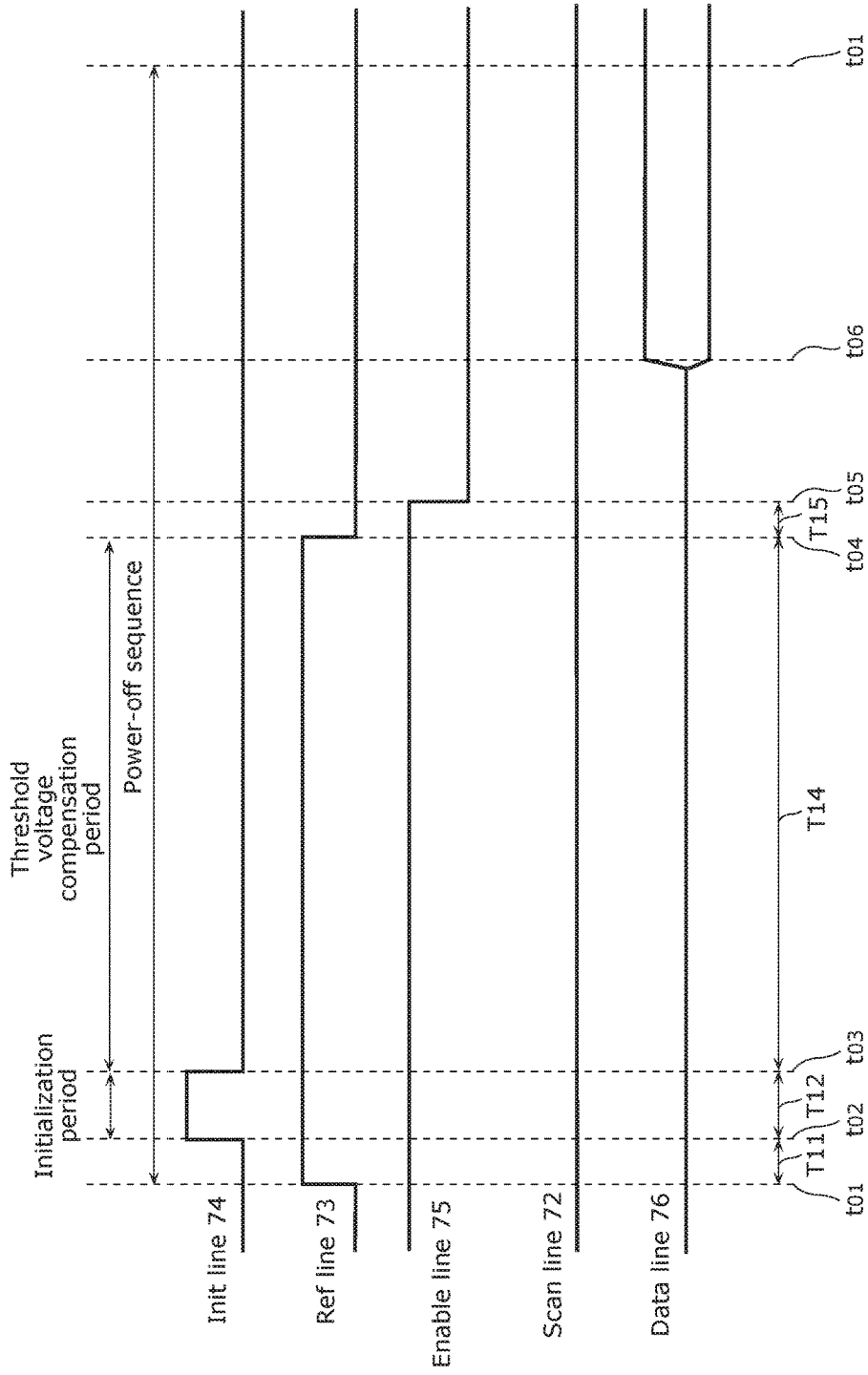
FIG. 10 is a time chart showing, in detail, examples of timings in a power-off sequence according to another embodiment.

The time charts shown in FIGS. 9 and 10 are effective in the case where the display apparatus 1 is large and when a voltage is applied to the node B by a Vini power supply 71, it takes time for the voltage of the node B to change to Vini on the plane of the display apparatus 1 due to the EL element 66 having a large capacitance.

When a time constant, which is the product of the total capacitance of the EL element 66 connected to the pixel to which voltage is supplied by one Vini power supply 71 and the Vini power supply line resistance, is 90 μsec or more, a difference is generated in the start time of a non light-emitting period between the pixels at the power supply end and the far end by the operation of the Init line 74. The difference generated in the start time of the non light-emitting period by the operation of the Init line 74 corresponds approximately to the time constant. For example, if one frame has a frequency of 120 Hz, 90 μsec corresponds approximately to 1% of the time, and thus the brightness changes by 1% depending on the pixel, causing a non-uniform display.

As another embodiment for reducing the difference in the start time of the non light-emitting period according to the present disclosure, a drive method in which a non light-emitting state is provided by a Ref line 73 and a Vref power supply 68 as shown in FIG. 9 has been invented.

The Ref line 73 has a smaller capacitance to be charged and discharged with respect to the pixel circuit than an Ini line 74, and in the Init line, an EL element 66 and a storage capacitor 67 serve as a load, but in the Vref power supply, only the storage capacitor 67 serves as a load. Also, in general, storage capacitors are smaller than EL elements, and thus the time constant of the Ref line 73 can be reduced to half or less. Accordingly, the difference in the start time of the non light-emitting period on the panel plane is less than 1%, and thus a non-uniform display is unlikely to occur.

The present embodiment has drive timings different from the drive timings of the normal display operation shown in FIG. 7 and the power-off sequence shown in FIG. 5 in the embodiment described above. An example of operations suitable for the above display apparatus will be described.

Examples of drive timings during normal display according to another embodiment will be described first.

FIG. 9 is a time chart showing, in detail, examples of timings in a normal display operation according to another embodiment. FIG. 9 is the same as FIG. 7 in that the initialization period, the threshold voltage compensation period, the write period and the light-emitting period are performed in this order, but is different from FIG. 7 in that the drive timings are partially different. Hereinafter, differences will be mainly described.

At time t01, the Ref line 73 is transitioned from a low level to a high level. With this transition, the EL element 66 is brought into a non light-emitting state.

The non light-emitting period of the EL element 66 can be adjusted by adjusting the width of a period T11.

At time t02, the Init line 74 is transitioned from a low level to a high level. With this transition, the initialization period starts.

Period T12 is an initialization period. In the initialization period, a period for sufficiently discharging the parasitic capacitance of the node B (the capacitance of the EL element 66) to the Init line 74 is provided. Also, the initialization period is also a period for discharging the parasitic capacitance of the node A so as to determine the potential. This period can be determined by a trade-off between charging for parasitic capacitance and the current flowing through the driving transistor 61. At the end of the period T12, the initial voltage required to flow the drain current for threshold voltage compensation of the driving transistor 61 is stored in the capacitive element 67.

At time 03, the Init line 74 is transitioned from a high level to a low level, and a threshold voltage compensation period starts.

Period T14 is a threshold voltage compensation period, which is the same as the period T24 shown in FIG. 7.

At time t04, by the fall of the Ref line 73, the switch 63 is changed from an on state to an off state, and the threshold voltage compensation period ends. At this point in time, the potential difference between the node A and the node B (the gate-to-source voltage of the driving transistor 61) is a potential difference corresponding to the threshold of the driving transistor 61, and this voltage is stored in the capacitive element 67.

When the switch 63 is changed from an on state to an off state at time t04, the gate potential of the driving transistor 61 varies, and thus period T15 is provided as a period for determining the gate potential within a line. This period will be referred to as a "REF transition period".

At time t05, the Enable line 75 is transitioned from a high level to a low level, the enable switch 65 is brought into an off state, and the supply of current to the driving transistor 61 is stopped.

Period T16 is a period for uniforming the potential of the EL anode power supply line 69 ($V_{TFT}$) in all pixels within a line after the enable switch 65 has been brought into an off state.

Period T17 is a write period, which is different from FIG. 7 in that the fall of the pulse of the Scan line 72 is overdriven. In other words, at time t07, the fall of the pulse is caused to drop to a potential lower than the normal low level. This is to, because the pulse of the Scan line 72 actually has a very round waveform, reduce the fall time so as to complete the writing into the capacitive element 67 at an early stage.

Period T18 is an overdrive period. However, the present disclosure provides advantageous effects regardless of whether or not to perform overdriving.

Period T19 is a period for determining the gate potential within a line because the gate potential of the driving transistor 61 varies due to the switch 62 being changed from an on state to an off state at time t07. This period will be referred to as an "SCN transition period".

At time t09, the Enable line 75 is transitioned from a low level to a high level. In response thereto, the light-emitting period starts.

Period T20 is a light-emitting period.

Next, examples of drive timings in a power-off sequence according to another embodiment will be described.

FIG. 10 is a time chart showing, in detail, examples of timings in a power-off sequence according to another embodiment. FIG. 10 is the same as FIG. 5 in that the initialization period and the threshold voltage setting period are performed in this order, but is different from FIG. 5 in that the drive timings are partially different.

Periods T11 to T15 shown in FIG. 10 are the same as the periods T11 to T15 shown in FIG. 9, which were already described above. Here, the operations performed after period T15 will be described.

Immediately after the end of period T15, in FIG. 9, a writing pulse is output to the Scan line 72, but in FIG. 10, the low level is maintained.

At time t05 at which the period T15 ends, each capacitive element 67 of a plurality of pixel circuits 60 stores a voltage corresponding to the threshold voltage of the corresponding driving transistor 61. Accordingly the voltage corresponding to the threshold voltage that is stored in the capacitive element 67 is maintained even after the power-off sequence ends and the display apparatus 1 is powered off. In other words, while the display apparatus 1 is powered off, a voltage corresponding to the threshold voltage is applied to the gate of the driving transistor 61. In this state, the electric field of the driving transistor is in a stable equilibrium state, and thus an electric stress is substantially suppressed.

Also, a Data line 76 does not output a pulse to be written at time t06 which is subsequent to time t05, and thus in the power-off sequence period, and thus "don't care" voltage (in other words, any voltage) may be output. In the power-off sequence, the data line drive circuit 5 may perform operation in the same manner as in the normal operation. In this case, at time t06, data that would be displayed if not in the power-off sequence is output. This data is, of course, not reflected on the display in the power-off sequence, and thus ignored.

As described above, even with the power-off sequence shown in FIG. 10, the same advantageous effects as those obtained in FIG. 5 can be obtained.

Furthermore, as the method for reducing the time constant, it is preferable to provide the Vref power supply line 68 vertically to the gate signal. As a result of the Vref power supply line being provided vertically, the number of pixels that need to be charged simultaneously by the Vref power supply line is reduced, and thus a non-uniform display can be further reduced.

Also, by providing a Vini line 71 vertically, even with the configuration shown in FIGS. 4 and 5, a non-uniform display is further reduced. However, the image quality is further improved by providing the Vref power supply 68 in the vertical direction. With the pixel circuit according to the present embodiment, when an image signal is stored in the storage capacitor 67, a voltage corresponding to a gradation signal is written by the potential difference between the gradation signal and the Vref power supply 68, and thus the display voltage may vary if the Vref power supply 68 is unsteady. FIG. 9 and the configuration in which the Vref power supply 68 is provided in the vertical direction are advantageous in that the load of the Vref power supply 68 is reduced to reduce the unsteadiness, and a non-uniform display can be reduced.

In the foregoing, the embodiments have been described above as examples of the technique disclosed in the present application. However, the technique according to the present disclosure is not limited thereto, and is applicable to an embodiment obtained through changes, replacement, addition, omission and the like as appropriate.

For example, the material for the semiconductor layer of the driving transistor and the switching transistors used in the light-emitting pixel according to the present disclosure is preferably, but is not particularly limited to, TAOS described above. For example, as TAOS, it is possible to use an oxide semiconductor material such as IGZO (In—Ga—Zn—O). A transistor including a semiconductor layer made of an oxide semiconductor such as IGZO has a little leak current. Also, in the case where transistors including a semiconductor layer made of an oxide semiconductor such as IGZO are used as the switches, the threshold voltage is set to a positive value, and thus the leak current from the gate of the driving transistor can be suppressed.

Also, in the embodiments given above, an organic EL element is used as the light-emitting element, but it is possible to use any light-emitting element as long as it is a light-emitting element that changes the amount of light emission according to the amount of current.

Also, the above-described display apparatus such as an organic EL display apparatus can be used as a flat panel display, and is applicable to various electronic devices equipped with a display apparatus, including a television set, a personal computer, a mobile phone and the like.

INDUSTRIAL APPLICABILITY

The present disclosure is applicable to a display apparatus, and more particularly to a display apparatus such as a television set.

The invention claimed is:

1. A method for powering off a display apparatus including a display panel having a plurality of pixel circuits arranged in rows and columns, each of the plurality of pixel circuits including: a light-emitting element that emits light according to an amount of current supplied; a driving transistor that supplies a current to the light-emitting element; and a capacitor that is directly connected to a gate of the driving transistor and stores a brightness voltage, the method for powering off a display apparatus comprising:
    detecting a power-off operation input to the display apparatus;
    upon detection of the power-off operation, setting the capacitor of each of the plurality of pixel circuits so as to have a black-level voltage; and
    stopping supply of power to the display panel immediately after the black-level voltage is set,
    wherein upon detection of the power-off operation, each of the capacitors of the plurality of pixel circuits stores a first voltage that is higher than a threshold voltage of the driving transistor and that does not cause the light-emitting elements to emit light, during which time a potential difference between a reference voltage and an initialization voltage of the driving transistor is set to a voltage larger than the maximum threshold voltage of the driving transistor.

2. The method for powering off a display apparatus according to claim 1,
    wherein in the setting of the voltage, the capacitor of each of the plurality of pixel circuits are collectively set at a time so as to have the black-level voltage.

3. The method for powering off a display apparatus according to claim 1,
    wherein the driving transistor is an n-type thin-film transistor, and supplies a larger current to the light-emitting element for higher values of the voltage stored in the capacitor, and
    the black-level voltage is a minimum of the brightness voltage of the light-emitting element.

4. The method for powering off a display apparatus according to claim 1,
    wherein the driving transistor is a p-type thin-film transistor, and supplies a smaller current to the light-emitting element for higher values of the voltage stored in the capacitor, and
    the black-level voltage is a maximum of the brightness voltage of the light-emitting element.

5. The method for powering off a display apparatus according to claim 1,
    wherein each of the plurality of pixel circuits further includes a switch connected to the capacitor, and
    the switch is a switching transistor made of an oxide semiconductor.

6. A display apparatus, comprising:
    a display panel having a plurality of pixel circuits arranged in rows and columns, each of the plurality of pixel circuits including
        a light-emitting element that emits light according to an amount of current supplied,
        a driving transistor that supplies a current to the light-emitting element, and
        a capacitor that is directly connected to a gate of the driving transistor and stores a brightness voltage;
    a controller configured to, upon detection of a power-off operation, set the capacitor of each of the plurality of pixel circuits so as to have a black-level voltage; and
    a power supply configured to stop supply of power to the display panel immediately after the black-level voltage is set,
    wherein upon detection of the power-off operation, each of the capacitors of the plurality of pixel circuits stores a first voltage that is higher than a threshold voltage of the driving transistor and that does not cause the light-emitting elements to emit light, during which time a potential difference between a reference voltage and an initialization voltage of the driving transistor is set to a voltage larger than the maximum threshold voltage of the driving transistor.

7. The display apparatus according to claim 6,
    wherein each of the plurality of pixel circuits further includes a switch connected to the capacitor, and
    the switch is a switching transistor made of an oxide semiconductor.

* * * * *